(12) United States Patent
Ojima et al.

(10) Patent No.: US 7,355,114 B2
(45) Date of Patent: Apr. 8, 2008

(54) SOLAR CELL AND ITS MANUFACTURING METHOD

(75) Inventors: Satoyuki Ojima, Annaka (JP); Hiroyuki Ohtsuka, Annaka (JP); Masatoshi Takahashi, Annaka (JP); Takenori Watabe, Annaka (JP)

(73) Assignees: Shin-Etsu Handotai Co., Ltd., Tokyo (JP); Shin-Etsu Chemical Co., Ltd., Tokyo (JP)

( * ) Notice: Subject to any disclaimer, the term of this patent is extended or adjusted under 35 U.S.C. 154(b) by 819 days.

(21) Appl. No.: 10/472,115

(22) PCT Filed: Mar. 19, 2002

(86) PCT No.: PCT/JP02/02569

§ 371 (c)(1),
(2), (4) Date: Sep. 17, 2003

(87) PCT Pub. No.: WO02/075816

PCT Pub. Date: Sep. 26, 2002

(65) Prior Publication Data

US 2004/0123897 A1 Jul. 1, 2004

(30) Foreign Application Priority Data

Mar. 19, 2001 (JP) ............................. 2001-078257
Mar. 19, 2001 (JP) ............................. 2001-079303

(51) Int. Cl.
*H01L 31/0248* (2006.01)
*H01L 31/068* (2006.01)

(52) U.S. Cl. .................................................. 136/243

(58) Field of Classification Search ................. 136/243
See application file for complete search history.

(56) References Cited

U.S. PATENT DOCUMENTS 4,453,030 A * 6/1984 David et al. ................ 136/256

(Continued)

FOREIGN PATENT DOCUMENTS

CN    02806810.6    6/2005

(Continued)

OTHER PUBLICATIONS

Verbeek, Martin et al., "Mechanically Grooved High-Efficiency Silicon Solar Cells With Self-Aligned Metallisation," Photovoltaic Specialists Conference, 1996, Conference Record of the Twenty-Fifth IEEE, May 13-17, 1996, pp. 521-524.

(Continued)

*Primary Examiner*—Kishor Mayekar
(74) *Attorney, Agent, or Firm*—Oliff & Berridge, PLC

(57) ABSTRACT

An OECO solar cell using a semiconductor single crystal substrate having a plurality of grooves, wherein a minimum groove depth h of each groove always satisfies the relation of $h \geq W_1 \tan \theta$ where $\theta$ represents an angle between a line connecting the lower end, along the thickness-wise direction of the semiconductor single crystal substrate, of an electrode formed in the groove and the upper end of the inner side face of the same groove having no electrode formed thereon, and a reference line normal to the thickness-wise direction, and $W_1$ represents a distance between both opening edges of the groove; wherein the semiconductor single crystal substrate has thickness decreasing from a first side of a first main surface to a second side opposed to the first side; and wherein the plurality of grooves have a depth distribution of being deepest at a thickest position of the substrate, and a gradually becoming shallower towards a thinnest position of the substrate.

15 Claims, 13 Drawing Sheets

U.S. PATENT DOCUMENTS 5,704,992 A    1/1998    Willeke et al.
6,172,297 B1   1/2001    Hezel et al.

FOREIGN PATENT DOCUMENTS

| | | |
|---|---|---|
| DE | 4033658 | 4/1992 |
| EP | 0 905 794 | 9/1998 |
| JP | 3-288476 | 12/1991 |
| JP | 2000-126934 | 5/2000 |

OTHER PUBLICATIONS

Hezel, R., et al., "A New Strategy for the Fabrication of Cost-Effective Silicon Solar Cells," *Renewable Energy*, vol. 14, Nos. 1-4, May 1998, pp. 83-88.

Hezel, R., et al., "A New Strategy for the Fabrication of Cost-Effective Silicon Solar Cells," *Renewable Energy*, May 1998, pp. 83-88, vol. 14, Nos. 1-4, Pergamon.

* cited by examiner

SOLAR CELL AND ITS MANUFACTURING METHOD

TECHNICAL FIELD

This invention relates to a solar cell and a method of fabricating the solar cell.

BACKGROUND ART

Recent demands for solar cells are directed to higher efficiency and lower costs at the same time. In this context, the OECO (obliquely evaporated contact) process attracts public spotlight. The OECO process is a method of fabricating solar cells proposed by R. Hezel et al. of Institut für Solarenergieforschung GmbH Hameln/Emmerthal (ISFH), Germany, and is representatively disclosed in *Renewable Energy*, Vol. 14, p.83 (1998) (a solar cell fabricated by the OECO process may occasionally be referred to as OECO solar cell, hereinafter). A method of fabricating the OECO cell will briefly be explained referring to FIG. 12. The OECO solar cell is configured so that a plurality parallel grooves 2' (having a sectional form of rectangular, semi-circle, triangular or the like) are carved on the main surface, which later serves as a light-receiving surface, of a silicon single crystal substrate 24' (referred to as "semiconductor single crystal substrate", or more simply to as "substrate", hereinafter), and so that each groove 2' has an electrode 6' for extracting output on the inner side face 2'*a* on one side as viewed along the width-wise direction. The grooves 2' are generally carved using a dicing saw. More specifically, the silicon single crystal substrate 24' is placed on the surface of a working table, and the grooves 2' are carved on the groove forming surface (light-receiving surface) 1'*a* of the silicon single crystal substrate 24' by horizontally moving the dicing saw while keeping a constant distance away from the surface of the working table. The formation of the electrode 6' on one side face 2'*a* of each groove 2' is conducted by vacuum evaporation which proceeds obliquely with respect to the main surface of the semiconductor single crystal substrate 24', which later serves as the light-receiving surface 1'*a*. This process allows an electrode material to deposit selectively on the side faces 2'*a* of the grooves and the top surface 2'*b* of projected ridges based on the shadowing effect exerted by the grooves itself on the metal to be deposited. Thickness of thus deposited metal differs between areas on the top surface 2'*b* of the projected ridges and areas on the inner side faces 2'*a*, so that an etching process successive to the evaporation process can successfully remove the metal so as to leave the electrodes only on the side faces, to a thickness as much as equivalent to a difference between the thickness on the side face 2'*a* and thickness on the top surface 2'*b*.

This constitution successfully reduced the shadowing loss of the solar cell to as small as approximately 5% of the total light-receiving area. Because a typical solar cell having the electrodes formed by the screen printing method generally suffers from a shadowing loss of as large as approximately 12%, it is understood that the OECO solar cell has a sharply reduced shadowing loss, and that a large energy conversion efficiency is attainable.

Solar cells currently put into practical use can be classified by source materials into those of silicon-base (single crystal, poly-crystalline and amorphous), those of compound semiconductor-base, and others. Among others, solar cells using silicon single crystal substrate are most widely fabricated by virtue of their excellent energy conversion efficiency and low production cost. The silicon single crystal substrates used for solar cells are generally fabricated by slicing a single crystal ingot using a wire saw, where the ingot is obtained by the Czochralski method (simply referred to as "CZ method", hereinafter), or the floating zone method (simply referred to as the FZ method, hereinafter). The substrates sliced out by the dicing saw are used as-sliced.

The slicing using the wire saw is, however, disadvantageous in that the amount of an abrasive grain retained in the working site increases as the depth of cutting into the ingot increases, and this gradually increases the cutting width. As a consequence, the semiconductor single crystal substrate 24' will have a thickness such as decreasing from the start-of-cutting side (left hand side in the drawing) towards the end-of-cutting side (right hand side in the drawing). It is thus understood that use of the as-sliced semiconductor single crystal substrate 24' is advantageous in reducing the production costs to a considerable degree through shortening of the process time, but is disadvantageous in making the thickness of the semiconductor single crystal substrate 24' non-uniform. The non-uniformity of the thickness amounts as much as 20 to 30 μm for 4-inch-diameter substrate, and the non-uniformity becomes larger as the diameter of the substrate increases.

Any conventional method of carving the grooves on the substrate 24' for fabricating the solar cells will be unsuccessful in obtaining a constant depth of the grooves 2' as measured from the light-receiving surface 1'*a* over the entire surface because of the non-uniformity in the thickness of the substrate 24'. More specifically, cutting with an upper-edge-type dicing saw, which keeps the lower edge thereof at a constant level of height, will carve deeper grooves 2' in the thicker portion of the substrate 24'.

On the substrate 24' having the grooves of non-uniform depths, formation of the electrodes 6' on the side faces 2'*a* of the grooves by the above-described vapor deposition process will result in heights of the electrode 6' smaller than the designed values, or undesirable deposition of the metal also on the bottom surface 2'*c* of the grooves. The electrode 6' having a height smaller than a designed value will cause a larger conduction loss at the electrode 6'. The formation of the metal on the bottom surface 2'*c* of the groove will increase the shadowing loss and thus ruin the energy conversion efficiency. Etching for removing the excessive deposition of the metal will, however, decrease electrode forming area and will thus increase the resistance loss. Both increases in the shadowing loss and resistance loss result in lowering of the energy conversion efficiency of the solar cell as a natural consequence.

Besides the above-described OECO solar cells, also other types of solar cells may cause variation in the characteristics if the depths of the grooves carved in the substrate 24' are non-uniform. In an exemplary case where the depth of the groove for electrode contact carved on the back surface of the solar cell is larger than a designed value, the boundary area between the electrode and substrate increases, and this results in increase in recombination rate at the boundary. On the contrary, the depth smaller than the designed value result in poor contact between the electrode and substrate, and this increases the contact resistance. In a still another exemplary case where the depths of the grooves carved on the light-receiving surface of the solar cell are non-uniform, variation in the boundary area causes difference in the recombination rates in the thickness-wise direction and the in-plane direction normal thereto. These variations in the characteristics result in variation in the output voltage, and may eventually lower the output of the solar cell.

It is therefore a first object of the invention to provide a solar cell having adequately-formed electrodes based on the OECO process in order to surely suppress the shadowing loss and resistance loss. It is a second object of the invention to provide a method of fabricating a solar cell having the grooves formed therein such as OECO solar cells, capable of readily making the depth of grooves uniform, and of realizing higher efficiency of the solar cell at low cost.

DISCLOSURE OF THE INVENTION

To accomplish the aforementioned first object, a solar cell according to a first aspect of the invention is such as having a light-receiving surface which is configured by a first main surface of a semiconductor single crystal substrate having a plurality of nearly-parallel grooves formed thereon, each groove having an electrode for extracting output disposed on the inner side face thereof only on one side in the width-wise direction thereof, wherein a minimum depth h of each groove satisfies the relation below:

$$h \geq W_1 \tan \theta \quad (1)$$

where, $\theta$ represents an angle between a line which connects the lower end, along the thickness-wise direction of the semiconductor single crystal substrate, of the electrode formed in one groove having the largest depth among all grooves as viewed along an arbitrary section normal to the longitudinal direction of the individual grooves, and the upper end of the inner side face of the same groove having no electrode formed thereon, and a reference line normal to the thickness-wise direction, and $W_1$ represents width of the groove defined by a distance between both opening edges of the groove.

As shown in FIG. 4, an angle $\theta$ between a line which connects the lower end LE, along the thickness-wise direction of the semiconductor single crystal substrate 24, of the electrode 6 formed on one side face 2a of a groove 2 and the upper end TE of the inner side face 2c of the same groove having no electrode formed thereon, and a reference line normal to the thickness-wise direction of the substrate corresponds to an angle of incidence (deposition angle) of vapor of an electrode material during a process of forming the electrode 6 by oblique-angled vapor deposition. The minimum depth h of each groove 2 refers to a depth of groove, having a thickness distribution along the longitudinal direction thereof, measured at a position where the depth is found minimum.

The inventors found after our extensive investigations that nonconformities such as formation of the electrode on the bottom surface of the grooves and insufficient formation area of the electrodes were effectively avoidable if the minimum depth h of the groove, width $W_1$ of the groove, and angle $\theta$ satisfy the condition expressed by the formula (1). Thus-configured solar cell ensures a sufficient depth of groove even for a short groove formed in the thinnest position of a substrate having non-uniform thickness, has the electrodes correctly formed with respect to the thickness-wise direction, and has resistance loss which never exceeds a desired value. The solar cell is also excellent in effect of reducing the shadowing loss, which is an intrinsic object of the OECO solar cells.

In order to ensure a sufficient mechanical strength of the solar cell per se, it is necessary to secure the thickness of, for example, silicon single crystal substrate as much as 150 to 300 μm or around. Because it is of course necessary to reduce thickness of the substrate in order to reduce the production cost of the solar cell, a merely simple strategy for forming deep grooves may undesirably make the solar cell unable to keep a sufficient mechanical strength. That is, it is preferable to keep a high level of mechanical strength while ensuring the depth of grooves specified by the invention.

Moreover, if the grooves are formed so as to leave a uniform thickness of the semiconductor single crystal substrate at the bottom portions of the individual grooves observed in the section, an in-plane distribution of the mechanical strength can be equalized, and this successfully eliminates the fear of causing cracks in the substrate originated from a specific position having only an insufficient thickness. It is to be noted that "uniform thickness" in the context of the present specification means that variation in the thickness falls within a range of ±10 m.

Advantages of forming the grooves in the aforementioned direction reside in the followings. The electrodes formed in the individual grooves 2 are so-called finger electrodes, and are connected with each other by a bus bar electrode, described later, for current collection formed in the direction along which the grooves are arranged. On the other hand, as shown in FIGS. 3A and 3B, assuming now that the thickest position of the semiconductor single crystal substrate as P2 and the thinnest position as P1, the grooves 2 formed approximately in the direction of a line connecting the positions P2 and P1 have a depth distribution expressing that the groove 2 is deepest on the position P2 side, and becomes gradually shallower towards the position P1 side. The area of the inner side face of the grooves per unit groove length, on which the finger electrode can be formed, decreases towards the position P1.

On the other hand, as shown in FIGS. 14, 15 and 16, the solar cell 1 has a bus bar electrode 30 for current collection which is formed on the first main surface of the semiconductor single crystal substrate 24 so as to across the individual grooves 2 in order to electrically connect the electrodes (see FIG. 1: referred to as "finger electrodes", hereinafter) 6 formed in the individual grooves. The bus bar electrode 30 may be formed so as to conform with an inner face profile of the grooves 2 as shown in FIG. 18, or so as to fill the individual grooves as shown in FIG. 19.

As shown in FIGS. 14, 15 and 16, a position of formation of the bus bar electrode 30 is preferably determined more closer to the thickest position P2 rather than to the thinnest position P1. Formation of the bus bar electrode 30 closer to the position P2 is advantageous because a region which tends to run short of the in-groove area for forming the finger electrode 6 can be brought apart from the bus bar electrode 30. Current density in the finger electrode 6 becomes smaller as it comes apart from the bus bar electrode 30, so that resistance loss which actually takes place due to voltage drop in the electrode having only a small current density is small even if there may be any causes for the resistance loss. According to the aforementioned arrangement of the grooves, it is therefore possible to align positions causative of shallow grooves on one edge side thereof apart from the bus bar electrode 30. This is advantageous in that, even if the electrode formation area is found, in the vapor deposition process, to be slightly smaller than a target designed value due to problems in the process accuracy, the resistance loss hardly takes place because such shortage in the electrode formation area can be found only in positions apart from the bus bar electrode 30. In any exemplary cases shown in FIGS. 14, 15 and 16, assuming now that the semiconductor single crystal substrate 24 is halved by a line DL drawn normally through the middle point of a line connecting the thickest position P2 and thinnest position P1, the entire portion of the bus bar electrode 30 falls within the half to which the thickest position P2 belongs. This configuration is advantageous in more effectively bringing the position P1 on the end of the finger electrode, which is affective to the resistance loss, further away from the bus bar electrode 30.

To which positions P1 and P2 is the bus bar electrode 30 more closer can be discriminated in this specification by a method described below. First, as shown in FIG. 17, base lines L2 and L1 are drawn at the positions P2 and P1, respectively, so as to contact with the outer contour of the semiconductor single crystal substrate 24. A pair of area-determining lines L3 and L4 are then drawn normally to the base line L2, and so as to contact with the outer contour of the semiconductor single crystal substrate 24, and a pair of area-determining lines L5 and L6 are drawn normally to the base line L1, and so as to contact with the outer contour of the semiconductor single crystal substrate 24. Assuming now that an area surrounded by the bus bar electrode 30, base line L2 and area-determining lines L3, L4 as S2, and an area surrounded by the bus bar electrode 30, base line L1 and area-determining lines L5, L6 as S1, the bus bar 30 is understood as being closer to the position P2 if a relation of S2>S1 holds.

As shown in FIG. 3A, the longitudinal direction of the individual grooves 2 preferably lies in parallel to, or inclined at an angle of 45° or less away from a line L which lies along the first main surface of the substrate, and connects the thickest position P2 (thickness=h2) and the thinnest position P1 (thickness=h1) of the semiconductor substrate, and more preferably lies in parallel as possible thereto (i.e., the above-described angle is as close as possible to 0°). This is because the individual grooves become deepest on the position P2 side and on the contrary become shallowest on the position P1 side when the line L lies in parallel to the longitudinal direction of the grooves 2, and this makes the minimizing effect of the resistance loss most eminent. The angle between the line L and the groove direction exceeding 45° results in a general shortage of the depth and, as a consequence, of the in-groove area of the grooves 2 located close to the position P1, and this undesirably increases the resistance loss.

Silicon single crystal substrate is most preferable as the substrate material for solar cells. Most of silicon single crystals manufactured by the CZ method have a pull-up axis in the <100> direction, so that the surface orientation of the substrates manufactured as substrate materials for solar cells generally have a surface orientation in the {100} direction. For the case where a large number of grooves are to be formed on the substrate having a surface orientation of nearly {100} (simply referred to as "{100} substrate", hereinafter) in the <110> direction on the main surface thereof, only a slight external force may cause cleavage of the substrate along the grooves and result in fracture if the sectional form of the grooves has a portion where stress tends to concentrate, or if the substrate retains a lot of damage produced during the groove carving. Defining now the direction of formation of the individual grooves as being disagreement with the <110> direction makes it possible to improve mechanical strength of the obtained solar cells to a considerable degree.

A method of fabricating a solar cell according to a second aspect of the invention comprises a step of forming a plurality of grooves at least on one main surface of a semiconductor substrate, wherein a groove-carving blade is allowed to rotate while keeping the edge portion of the groove-carving blade projected by a predetermined height over a flat substrate feeding surface of a working table, and carving the grooves on one main surface of the semiconductor substrate while keeping the main surface in close contact with the substrate feeding surface, and moving the substrate along the substrate feeding surface relative to the groove-carving blade in the direction normal to the thickness-wise direction of the groove-carving blade.

In the above-described method of fabricating a solar cell of the invention, one main surface of the semiconductor substrate, on which the grooves are to be formed, is kept in close contact with the substrate feeding surface of the working table, so that one main surface of the semiconductor substrate and the substrate feeding surface are kept in parallel as a natural consequence. Meanwhile the edge portion of the groove-carving blade is kept as being projected by a predetermined height over the flat substrate feeding surface of the working table, so that, if the semiconductor substrate is moved relative to the rotating groove-carving blade in the direction normal to the thickness-wise direction of the groove-carving blade, one main surface of the semiconductor substrate, which is kept in parallel to the substrate feeding surface, will have formed thereon the grooves having a constant depth. This successfully equalizes the shadowing effect between every adjacent grooves of the OECO solar cell, and makes it possible to form the electrodes having a nearly uniform size in the individual grooves. This further makes it possible to form the individual electrodes correctly conforming to a design value, and to suppress the resistance loss, shadowing loss or the like. The present method is also successful in equalizing the depth of grooves of the solar cells other than OECO solar cells, so that variation in characteristics of the solar cells can be suppressed, and decrease in the output is avoidable.

In the invention, the groove-carving blade comprises a plurality of edge portions which are concentrically joined at regular intervals and can rotate together, and all of the edge portions (also referred to as "groove-carving edge complex", hereinafter) are projected by the same height out from the flat substrate feeding surface of the working table. Adoption of thus-configured, groove-carving edge complex makes it possible to form a plurality of grooves corresponding to such plurality of edge portions in a collective manner by moving the semiconductor substrate relative to the complex only once. Because the height of projection of the individual edge portions are the same with each other, the grooves formed en bloc have the same depth. Since the individual edge portions are joined to the groove-carving edge complex at regular intervals, the main surface of the semiconductor substrate consequently has formed thereon a plurality of parallel grooves arranged at regular intervals. While it is allowable to repeat the collective groove formation several times to thereby form the grooves over the entire main surface, it is more advantageous from the viewpoint of productivity to configure the groove-carving edge complex with edge portions in a number equivalent to, or larger than a number of grooves to be formed on the semiconductor substrate, and to form the groove over the entire main surface by relatively moving the semiconductor substrate only once.

The working table available in the invention may be such as having a shaving discharge grooves on the substrate feeding surface thereof. For the case where the grooves are formed on the main surface of the semiconductor substrate, portions of the substrate where the grooves are to be formed are carved with the edge portions of the groove-carving blade, so that shaving generates as the groove formation proceeds. If thus-generated shaving is left unremoved, the shaving resides between the semiconductor substrate and working table to thereby ruin a desirable contact status between the semiconductor substrate and working table. More specifically, the semiconductor substrate is elevated from the working table by an amount approximately equivalent to grain size of the shaving, and this slightly ruins the parallel relation between the substrate feeding surface of the working table and the main surface of the semiconductor substrate on which the grooves are to be formed. This prevents depth of the grooves formed on the main surface from being kept constant. For example, the grooves formed after generation of a large amount of shaving tend to become relatively shallower than those formed in the initial stage.

Formation of the shaving discharge grooves on the substrate feeding surface of the working table is, however, successful in always keeping a desirable close contact status between the substrate feeding surface of the working table and the main surface of the semiconductor substrate on which the grooves are to be formed, because the generated shaving is trapped by the grooves even if a large amount of shaving is generated as the groove formation proceeds. This eventually makes it possible to keep the depth of grooves constant in the early stage and later stage of the groove formation. Thus the resistance loss and shadowing loss of the solar cell can be reduced as described in the above, and the energy conversion efficiency can be improved. Moreover, formation of the shaving discharge grooves also contributes to reduction in contact area between the semiconductor substrate and the working table, and this consequently reduces friction resistance during the relative movement of the semiconductor substrate. Process efficiency of the groove formation and productivity are thus improved.

The above-described method of fabricating a solar cell is successful in making the depth of the resultant grooves uniform, and in fabricating a solar cell having a distribution range of groove depth (difference between a maximum value and a minimum value) over the entire surface of the groove-forming surface suppressed to as small as ±5% or less of a distribution range of substrate thickness (difference between a maximum thickness and a minimum thickness).

BEST MODES FOR CARRYING OUT THE INVENTION

The following paragraphs will describe best modes for carrying out the invention making reference to the attached drawings.

First Embodiment 1

Figure 1:
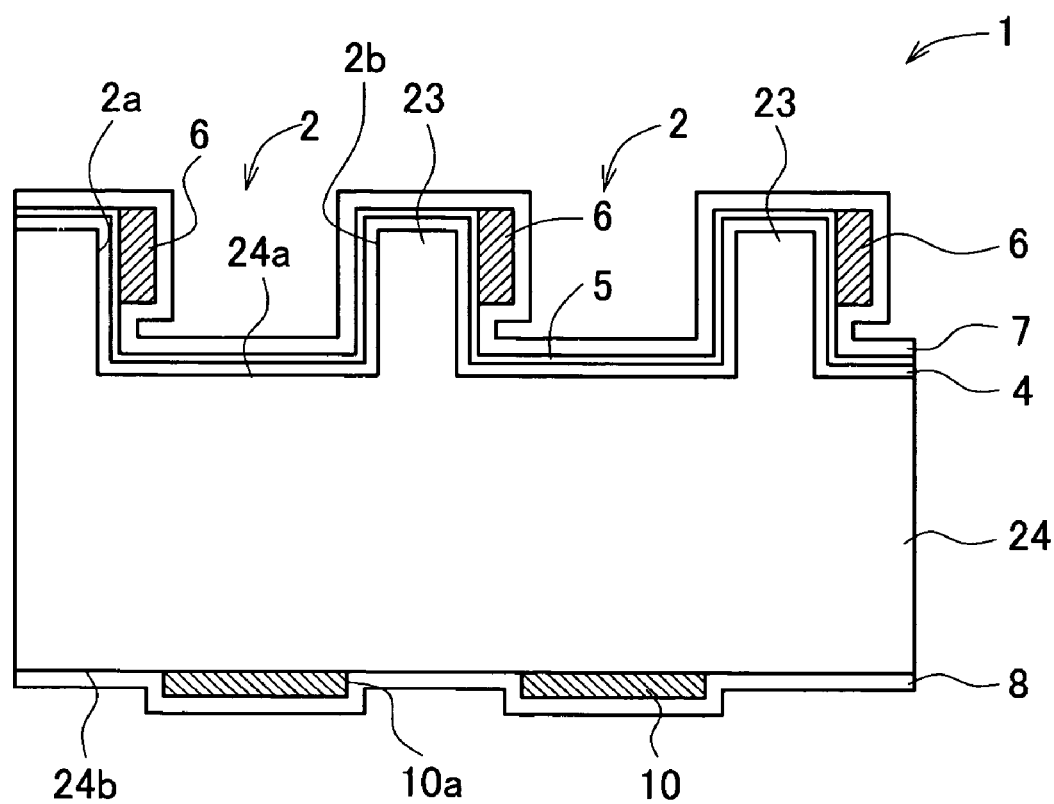
FIG. 1 is an enlarged sectional view partially showing one embodiment of a solar cell of the invention.

FIG. 1 is an enlarged sectional view partially showing one embodiment of a solar cell according to a first aspect of the invention. The solar cell 1 is configured so that a large number of grooves 2 of several-hundred-micrometers wide and approximately several tens micrometers to 100 μm deep are formed in parallel on the first main surface 24a of a p-type silicon single crystal substrate 24 sliced out from a silicon single crystal ingot. These grooves 2 can be carved en bloc using a set of hundreds to thousands of concentrically-joined rotary cutting edges which rotate all together, where it is also allowable to divide the carving operation into several numbers of run.

On the first main surface 24a of the substrate 24 having the grooves 2 thus formed thereon, an emitter layer 4 is formed by thermally diffusing phosphorus as an n-type dopant, so as to produce a p-n junction portion. On the emitter layer 4, a thin silicon oxide film 5 which functions as a tunnel insulating film is formed typically by the thermal oxidation process.

On the silicon oxide film 5 on the inner side faces of the grooves 2 only on one side in the width-wise direction, electrodes 6 are formed. The electrodes 6 are such as those formed by depositing an electrode material (e.g., metal such as aluminum) on the inner side faces of the grooves using a vapor deposition apparatus, where in the process of deposition, the substrate 24 is disposed as being relatively inclined at a least-necessary angle or more, so as to allow the electrode material to deposit on the inner side face predominantly on one side in the width-wise direction of each groove. While excessive electrode material deposits also on the top surface of the projected ridges 23 formed between every adjacent grooves 2, 2 during the deposition, the excessive portion can be removed using an etching solution such as hydrochloric acid solution. The entire portion of the first main surface 24$a$ of the substrate 24 including the electrodes 6 is covered with a silicon nitride film 7 which functions as a protective film and an anti-reflection film.

Figure 2A:
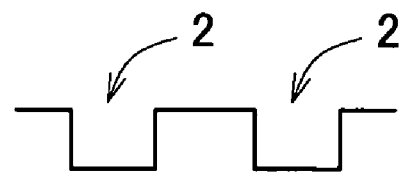
FIG. 2A is a first example of the groove form.
Figure 2B:
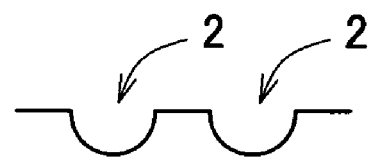
FIG. 2B is a second example of the groove form.
Figure 2C:
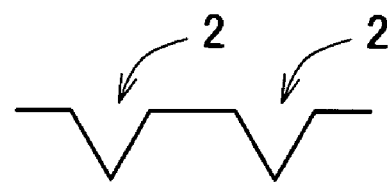
FIG. 2C is a third example of the groove form.

Each groove 2 preferably has either rectangular contour in a sectional view normal to the longitudinal direction thereof as shown in FIG. 2A, semicircular contour as shown in FIG. 2B, and V-contour as shown in FIG. 2C, because these morphologies can readily be obtained by cutting using a peripheral blade cutting.

Figure 2D:
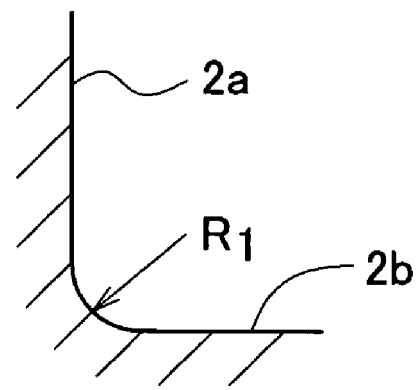
FIG. 2D is a first example of rounding an angled portion of the groove.
Figure 2E:
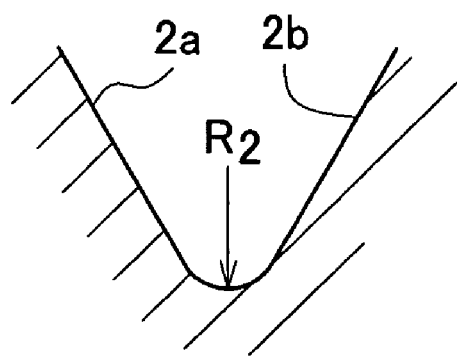
FIG. 2E is a second example of rounding an angled portion of the groove.

For the case where the groove 2 has a rectangular contour in a sectional view normal to the longitudinal direction thereof as shown in FIG. 2A, or V-contour as shown in FIG. 2C, the contour has two edge portions 2$a$, 2$b$ crossed with each other as shown in FIG. 2D or FIG. 2E. In an rectangular groove, the edge portions 2$a$ and 2$b$ correspond to the side wall and bottom of the groove, respectively, as shown in FIG. 2D, showing an angle of cross of the both of 90° or around. On the other hand, V-formed groove has the edge portions 2$a$, 2$b$ crossed at an acute angle at the bottom of the groove. Both cases tend to result in stress concentration and in lowered strength of the solar cell if the abutment is made at an acute angle. Provision of rounding R1 and R2 at the cross position of the edge portions 2$a$, 2$b$ as viewed in a sectional contour is now successful in further raising the mechanical strength of the solar cell.

Degrees of the rounding R1 and R2 are preferably set within a range which ensures a sufficient effect of preventing stress concentration, and which does not ruin effects such as reduction in the series resistance due to groove morphology, where a preferable range is typically 2 to 20 μm or around. The rounding can readily produced by chemical etching after the grooves are carved by the peripheral blade cutting or the like. The chemical etching may be carried out in common with the etching for removing damage generated during the groove carving. Amount of etching is preferably within a range from 5 to 20 μm or around so as to make the rounding fall within the above described preferable range. Aqueous potassium hydroxide solution is typically used as a chemical etching solution.

Meanwhile, substrates obtained by slicing, using a wire saw, an ingot manufactured by the Czochralski (simply referred to as the "CZ method", hereinafter) or by the floating zone melting method (simply referred to as the "FZ method", hereinafter) are generally non-uniform in the thickness (FIG. 3A), where variation thereof amounts as much as 20 to 30 μm for 4-inch substrates, and further increases for larger substrates. This is because the slicing using the wire saw causes a larger amount of an abrasive grain retained in the working portion as the depth of cutting into the ingot increases, and this gradually increases the cutting width.

Figure 4:
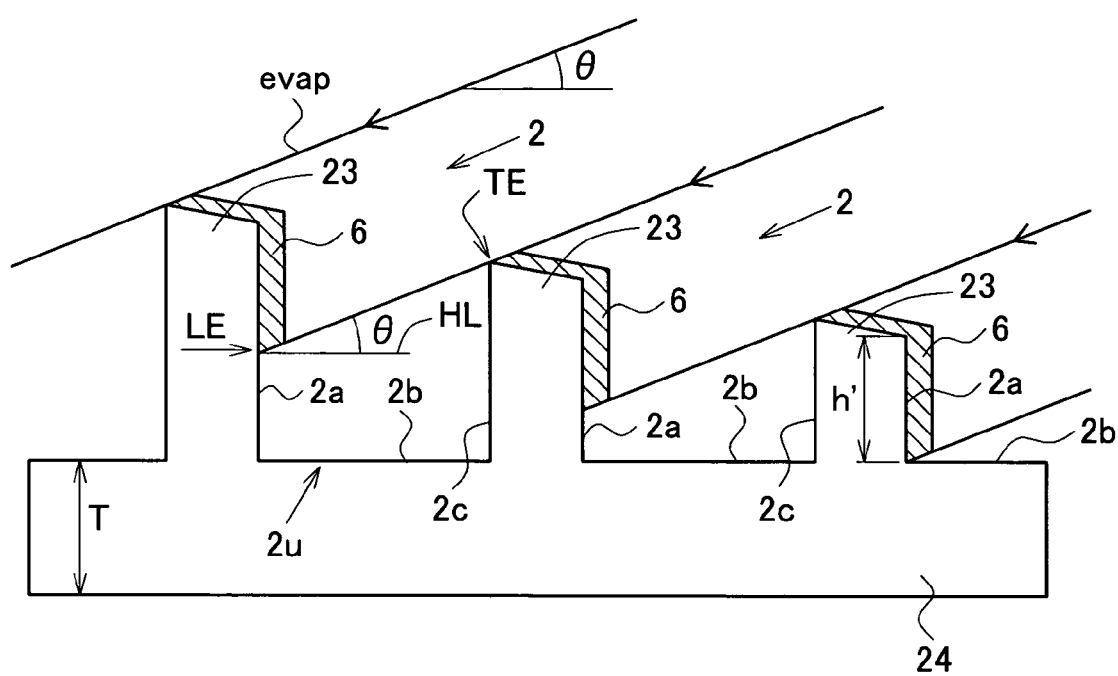
FIG. 4 is a schematic sectional view showing a solar cell having sufficient depths of grooves of the invention.

If the grooves 2 are carved en bloc using a dicing saw on the substrate 24 having non-uniform thickness, the resultant grooves 2 will have non-uniform depths as shown in the schematic sectional view of FIG. 4. In the OECO process, to what area on the inner side face of the grooves only on one side the electrodes can be formed is determined by depth of the grooves and direction of vapor deposition (evap in FIG. 4). Angle θ of vapor deposition herein is defined as an angle between a line which connects the lower end LE, along the thickness-wise direction T of the semiconductor single crystal substrate 24, of the electrode 6 formed in one groove 2$u$ having the largest depth among all grooves 2 as viewed along an arbitrary section (i.e., a section seen in the drawing) normal to the longitudinal direction of the individual grooves (i.e., the direction normal to the sheet of drawing), and the upper end TE of the inner side face 2$c$ of the same groove 2$u$ having no electrode formed thereon (non-electrode-forming inner side face), and a reference line HL normal to the thickness-wise direction of the substrate.

For the case where the height of projected ridges 23 located between every adjacent grooves 2, 2 is insufficient, trial of forming the electrodes in desired regions results in deposition of the electrode material not only on the edge portions 2$a$ along the projected ridges 23 but, depending on the angle θ of deposition, undesirably also on the edge portions 2$b$ which correspond to the bottom of the grooves. This unnecessarily increases the area to be etched off by the later etching, and fails in obtaining necessary electrodes.

Figure 5A:
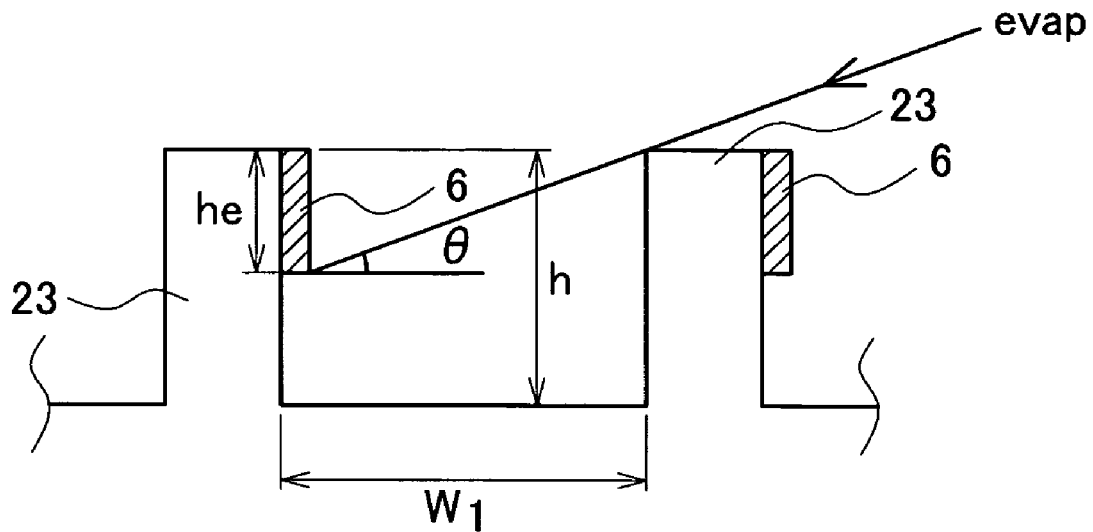
FIG. 5A is a schematic drawing for explaining a method of determining depth of a rectangular-sectioned groove.

In the invention, all grooves are always ensured with sufficient depths, which are enough for preventing the electrodes from being deposited on the edge portions 2$b$ which correspond to the bottom of the grooves, even at the thinnest position (position P1 in FIG. 3A) of the substrate 24 as shown in FIG. 4. Referring now to FIG. 5A, assuming that the depth of grooves as h, and the height of electrode as $h_e$ when observed in an arbitrary section normal to the longitudinal direction of the grooves, the height of electrode he in the direction of groove depth (in the direction of substrate thickness) can be expressed as below using the width of groove $W_1$ defined as a distance between both opening edges of the groove, and the angle of deposition θ defined in the above:

$$h_e = W_1 \tan \theta$$

Therefore, if the depth of groove h' at the thinnest position is ensured as sufficiently large so as to satisfy the relation below:

$$h' \geq W_1 \tan \theta \text{ (same as the formula (1) in the above)}$$

the electrodes 6 are no more deposited on the edge portions 2$b$ corresponded to the bottom of the grooves. Since the depth of groove becomes minimum at the thinnest position, depths of grooves h in any other positions always satisfy the formula (1), and as a consequence the invention can prevent an arbitrary groove from causing nonconformity that the electrode 6 is deposited on the edge portion 2$b$ corresponded to the bottom of the groove.

Figure 5B:
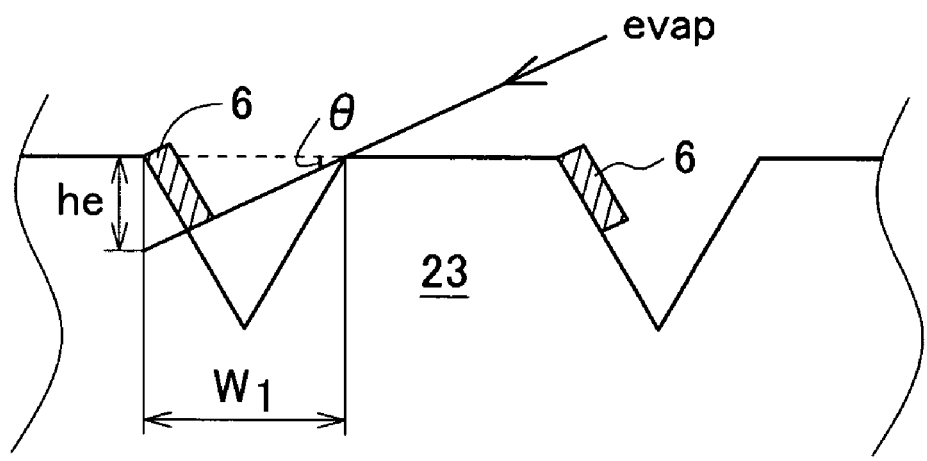
FIG. 5B is a schematic drawing for explaining a method of determining depth of a V-sectioned groove.

It is to be noted that the formula (1) approximately holds also for the V-groove shown in FIG. 5B. Assuming now that a groove in focus is the deepest groove among those formed on the substrate, the electrode will never be formed excessively or insufficiently if the shallowest groove on the substrate has a depth of h or more.

Referring now back to FIG. 1, on the other main surface 24$b$ (referred to as "second main surface", hereinafter) of the solar cell 1, a back electrode layer 8 is formed while placing, for example, a silicon nitride film 10 in between. The silicon nitride film 10 is formed as a protective film, and can be formed by the CVD (chemical vapor deposition) process. The back electrode layer 9 is formed so as to cover the entire portion of the second main surface 24*b*, and is typically composed of an aluminum deposited layer. The back electrode layer 8 is configured so as to contact with the underlying silicon single crystal 24 through contact penetrating portions 10*a* which penetrate the silicon nitride film 10 in the thickness-wise direction thereof. While the contact penetrating portions 10*a* may be formed by photolithography, those in the present embodiment are grooves carved by mechanical processing or holes bored by laser processing.

In order to ensure a sufficient mechanical strength of the solar cell per se, the thickness of the silicon single crystal substrate 24 is selected as much as 150 to 300 μm or around. Because it is of course necessary to reduce thickness of the substrate in order to reduce the production cost of the solar cell, a merely simple strategy for forming deep grooves may undesirably make the solar cell unable to keep a sufficient mechanical strength. That is, it is preferable to limit the depth of grooves typically to 100 μm or less while ensuring the depth of grooves specified by the invention.

In FIG. 1, the individual grooves 2 of the solar cell 1 are formed in a direction disagreement with the <110> direction on the first main surface 24*a*. This improves the mechanical strength of the solar cell 1. It is to be understood in this specification that any substrate is assumed as having a surface orientation of {100} if the crystallographic principal axis of the substrate used herein is an off-angled substrate having an angle of inclination of up to 6° away from the <100> direction.

Next paragraphs will describe an exemplary method of fabricating the solar cell 1.

First a p-type silicon single crystal ingot, which is prepared by adding a Group III element such as boron or gallium to a high-purity silicon, is obtained, and p-type silicon single crystal substrates having a surface orientation of {100} are sliced out from the ingot. The p-type silicon single crystal substrate typically has a specific resistivity of 0.5 to 5 Ω·cm. Next, as shown in process (a) in FIG. 6, a plurality of parallel grooves 2 of 20 to 100 μm deep are formed on the first main surface 24*a* of the p-type {100} substrate using a high-speed rotary blade in a direction in disagreement with <110>, typically in the <100> direction, using a high-speed rotary blade DS (FIG. 3B). While the silicon single crystal substrate may be prepared by either of the CZ method and FZ method, it is more preferably prepared by the CZ method in view of the mechanical strength of the resultant substrate. While the thickness of the substrate of as small as 40 μm may ensure a sufficient mechanical strength, the thickness is more preferably 150 to 300 μm or more in consideration of convenience of the slicing operation and the depth of the grooves to be carved thereon.

The high-speed rotary blade is selected for example from those having a rectangular section, semicircular section and angular section, depending on the desired morphology of the groove. The grooves 2 can be carved by cutting the main surface of the substrate 1 using the aforementioned high-speed rotary blade at a cutting speed of approximately 0.1 to 4 cm per second while injecting a cutting fluid. It is also allowable to use a dicer or wire saw in place of the high-speed rotary blade.

Figure 3A:
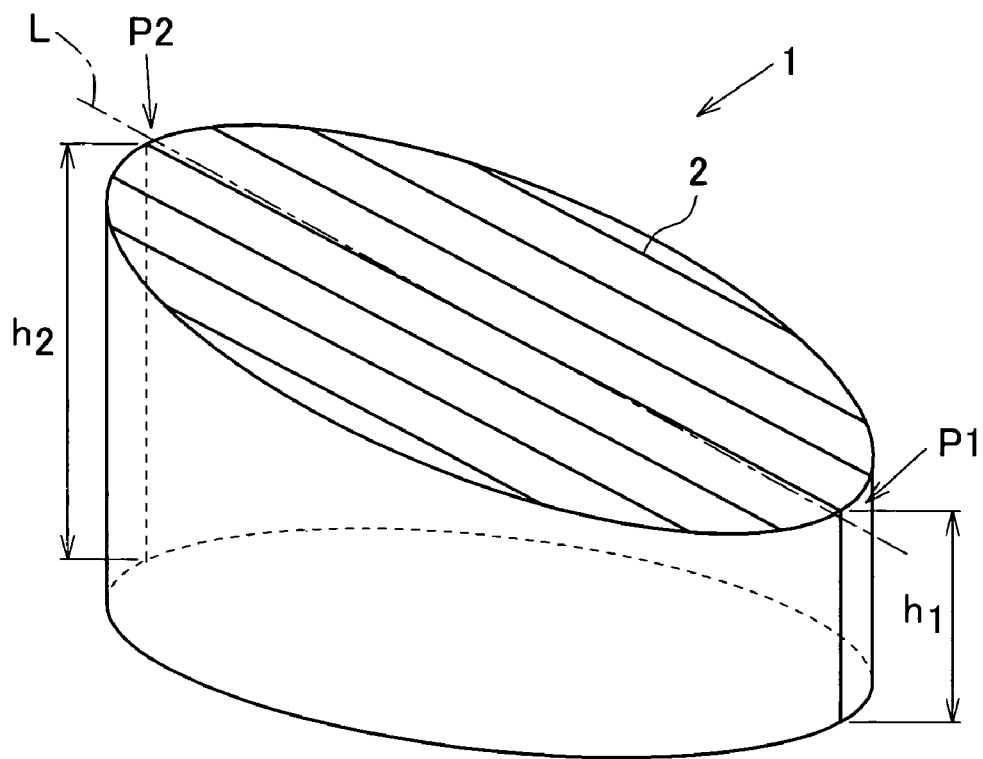
FIG. 3A is a schematic drawing showing a single crystal substrate having a non-uniform thickness.
Figure 3B:
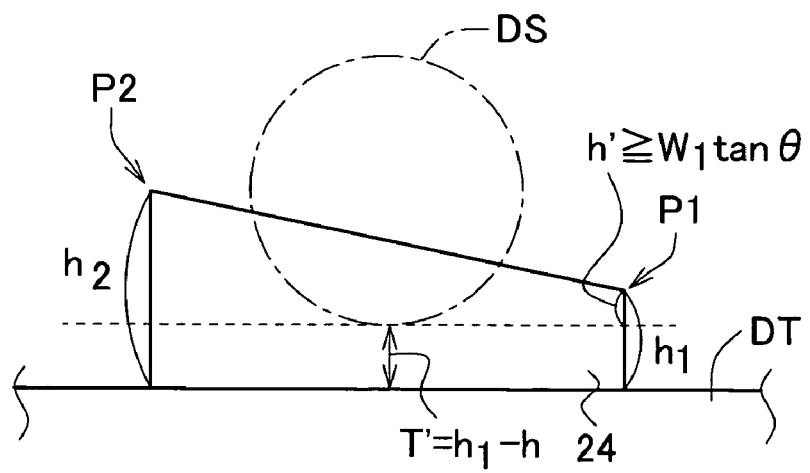
FIG. 3B is a schematic drawing showing a method of forming grooves on the substrate shown in FIG. 3A.

As has been described in the above referring to FIG. 3A, it is preferable in view of reducing resistance loss of the electrodes (finger electrodes) formed on the inner faces of the grooves that the longitudinal direction of the individual grooves 2 lies in parallel to, or inclined at an angle of 45° or less away from a line L which lies along the first main surface of the substrate, and connects the thickest position P2 (thickness=h2) and the thinnest position P1 (thickness=h1) of the semiconductor substrate. For the case where the directions of the line L and the grooves 2 are set in parallel, the grooves satisfying the aforementioned formula (1) can be formed as described below. First the positions P1 and P2 are preliminarily determined by measuring a thickness distribution of the substrate. Next as shown in FIG. 3B, the substrate 24 is set on a table DT so that the cutting direction of the high-speed rotary blade DS agrees with the direction of the line connecting the positions P1 and P2. A value of $W_1 \tan \theta$ is also preliminarily determined using values for groove width $W_1$ and angle of vapor deposition θ, both of which are design values, and then a cutting depth of the high-speed rotary blade DS is set so that groove width h' at the position P1 becomes larger than $W_1 \tan \theta$, and so that a sufficient substrate thickness T' (typically 40 μm or more) is retained at the positions below the bottoms of the individual grooves. The substrate thickness T' remaining below the bottoms of the individual grooves 2 can be expressed as h1−h'.

Next, damage generated in the substrate after the groove formation is removed by the aforementioned chemical etching. When the groove has a rectangular form or V forms as shown in FIG. 2A or 2C, conditions for the etching for removing the damage are preferably adjusted so as to properly round the grooves as shown in FIG. 2D or FIG. 2E. After completion of the etching for removing damages, a texture structure is then formed on the main surface of the substrate, which is carried out as a surface roughening for reducing the reflection loss, by any publicly-known methods such as anisotropic etching. After the texture is formed, the substrate is washed in an acidic aqueous solution such as containing hydrochloric acid, sulfuric acid, nitric acid, hydrofluoric acid, or mixed solution thereof, where washing in hydrochloric acid is preferable from the viewpoints of economy and production efficiency.

Figure 6:
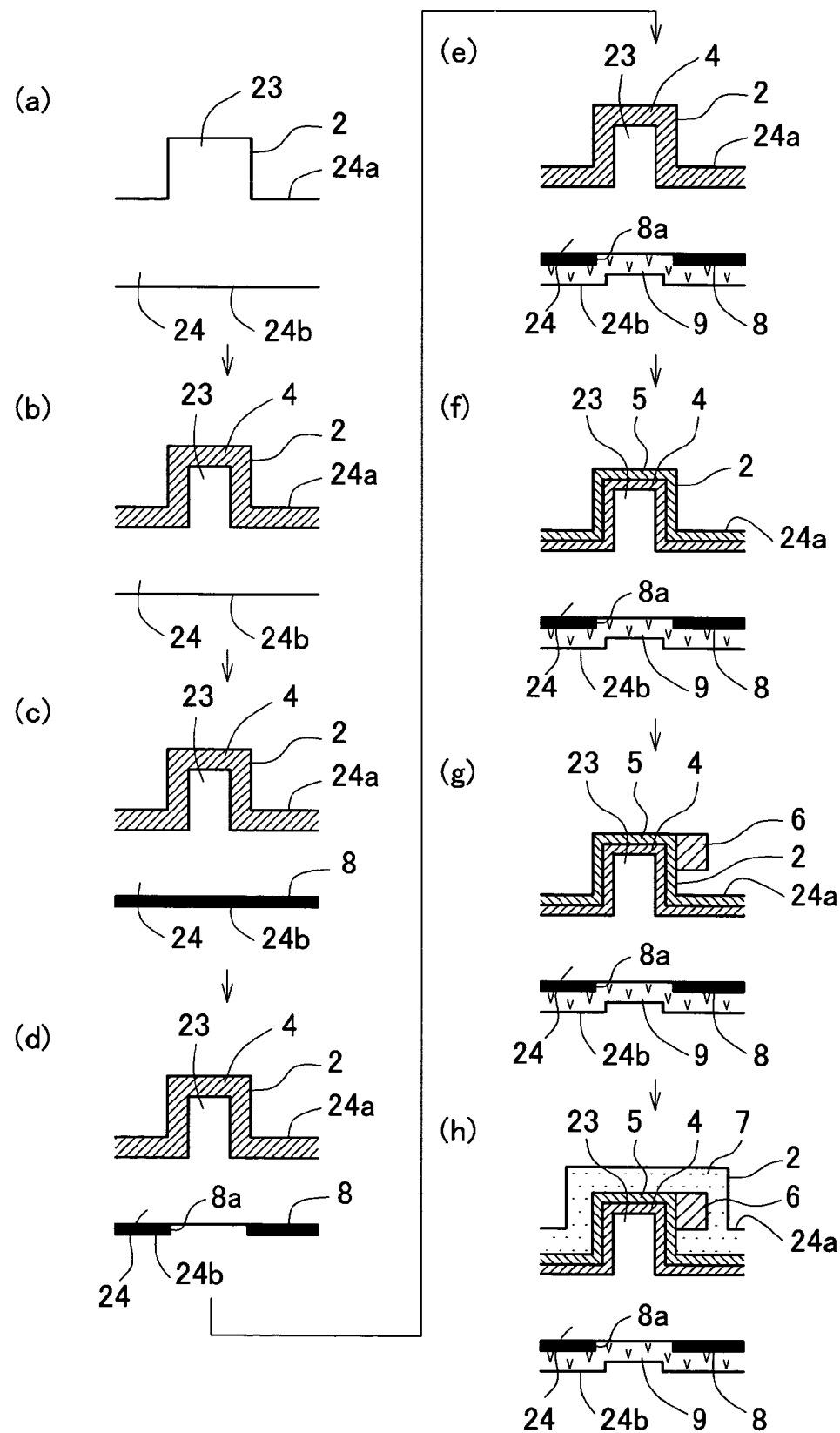
FIG. 6 is a schematic sectional view showing process steps for fabricating the solar cell.

Next, as shown in process (b) in FIG. 6, an emitter layer 4 is formed in the surficial portion of the substrate after washing. Methods of forming the emitter layer may be any of the coating diffusion method using diphosphorus pentoxide, ion implantation method for directly implanting phosphorus ion, and so forth, but a preferable method from the economical viewpoint is the vapor-phase diffusion method using phosphoryl chloride. In an exemplary process, the n-type emitter layer 4 can be formed by annealing the substrate in a phosphoryl chloride atmosphere at 850° C. or around. Thickness of the emitter layer 4 is typically 0.5 μm or around, and the sheet resistance is within a range from 40 to 100 Ω/□ or around. A phosphorus glass formed in the surficial portion of the substrate during the process is removed in a hydrofluoric acid solution.

Next, electrodes are formed on the second main surface 24*b* side of the substrate. First, as shown in process (c) in FIG. 6, a silicon nitride layer 8 is formed as a passivation film on the second main surface 24*b*. The silicon nitride layer 8 can be formed by the CVD (chemical vapor deposition) process. Any of the normal-pressure CVD process, reduced-pressure thermal CVD process, photo CVD process and so forth is applicable herein, where the remote plasma CVD process is particularly preferable for the invention, because the process can proceed at lower temperatures ranging from 350 to 400° C. or around, and can reduce the surface recombination speed of the silicon nitride layer 8 to be obtained. It is to be noted that the direct thermal nitrification method is not preferable because the process cannot afford a sufficient thickness of the resultant layer.

Next as shown in process (d) in FIG. 6, grooves 8a for electrode connection are formed in thus-formed silicon nitride layer 8 so as to reach the underlying p-type silicon single crystal substrate 24 using the high-speed rotary blade similar to that used for the groove carving. Profile of the cutting edge is selected typically from the rectangular form, semicircular form, and angular form depending on a desired sectional form of the grooves. After the grooves 8a are thus formed, an electrode 9 is then formed so as to cover the grooves 8a together with the peripheral silicon nitride layer 8 as shown in process (e) in FIG. 6. Although silver or copper is available as the electrode material herein, aluminum (including alloys thereof) is most preferable in view of economy and workability. Aluminum can be deposited by either method of sputtering and vapor deposition. All processes for forming the electrode on the second main surface 24b side thus complete.

Next as shown in process (f) in FIG. 6, the silicon oxide film 5 is formed on the first main surface 24a by the thermal oxidation method. The silicon oxide film 5 serves as a tunnel insulating film between the electrode 6 on the first main surface 24a and the substrate 24, and preferably has a thickness of 0.5 to 3 nm in order to optimize tunneling effect while preventing short-circuiting. The silicon oxide film 5 can be formed by any known methods including dry oxidation, wet oxidation, steam oxidation, pyrogenic oxidation, oxidation in chlorine-containing ambient and so forth, and among others, dry oxidation is preferably adopted since the method can ensure a high film quality and easy control of the thickness.

On the substrate 24 having the silicon oxide film 5 already formed thereon, the electrodes 6 are formed on the inner side faces of the grooves 2 only on one side as viewed in the width-wise direction of the grooves 2, typically to as thick as approximately 5 µm by the oblique-angled vapor deposition process. Although aluminum (including alloys thereof) is most preferably used herein for the electrode material, the material is not limited thereto, and other metals such as silver, copper or the like can be used. More specifically, the substrate 24 is placed in a vapor deposition apparatus so as to incline the principal axis thereof at 70° to 89° away from the referential position, where the referential position is defined as a position where the first main surface 24a is oriented to the evaporation source so that the extending direction of the grooves crosses normal to the evaporation source. This placement successfully allows the electrode material to deposit predominantly on the inner side face of the grooves 2 only on one side as viewed in the width-wise direction. The deposition is preferably effected only after the degree of vacuum in the apparatus reaches to a level as low as $2 \times 10^{-5}$ Pa or below, and the deposition speed is adjusted to 1.0 to 1.5 nm/sec (but not limited thereto). Next as shown in process (g) in FIG. 6, the substrate 24 having the electrodes 6 deposited thereon is dipped into an acidic aqueous solution containing hydrochloric acid, sulfuric aid, nitric acid, hydrofluoric acid or mixed solution thereof, to thereby remove the unnecessary portion of the electrode material deposited on the top surfaces of the projected ridges 23 disposed between every adjacent grooves 2, 2.

Figure 14:
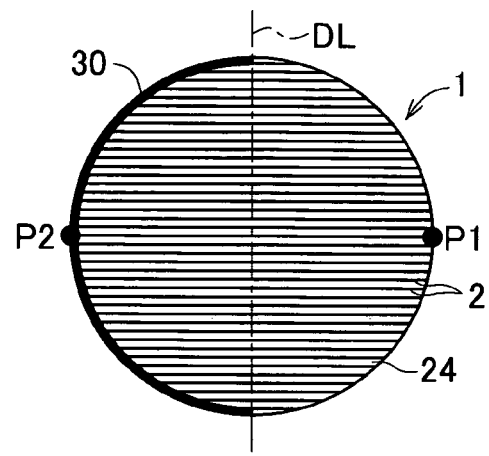
FIG. 14 is a plan view showing a first embodiment of formation status of a bus bar electrode.
Figure 15:
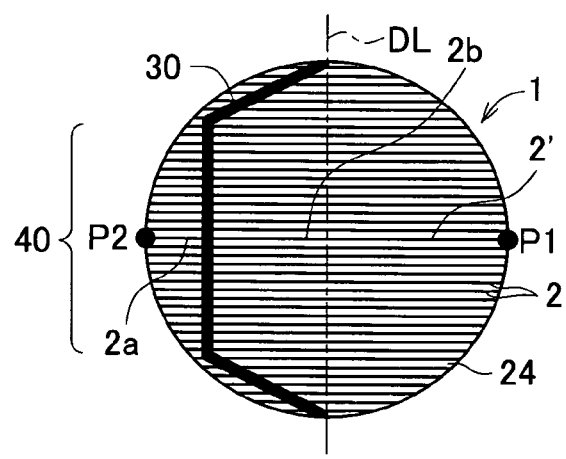
FIG. 15 is a plan view showing a second embodiment of formation status of a bus bar electrode.
Figure 16:
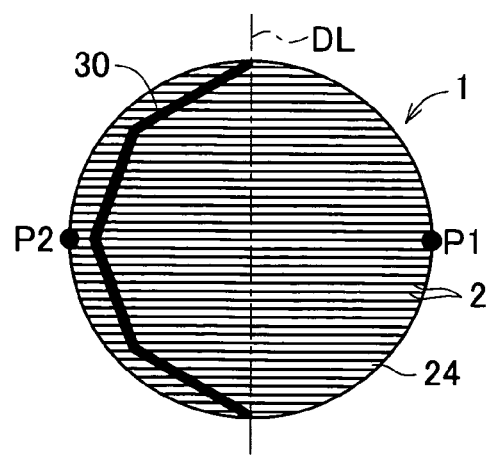
FIG. 16 is a plan view showing a third embodiment of formation status of a bus bar electrode.
Figure 17:
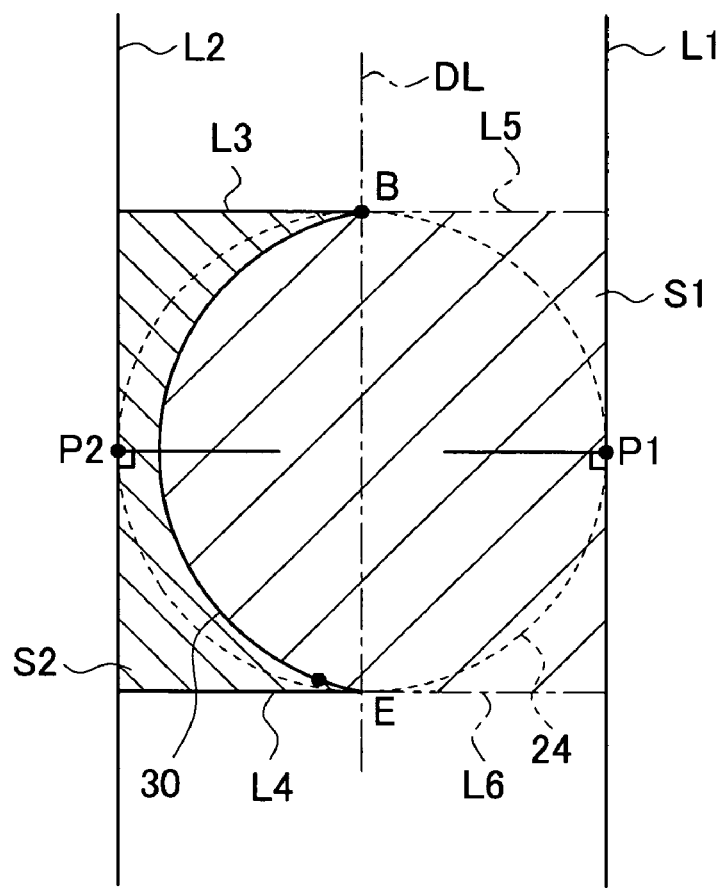
FIG. 17 is a drawing for explaining a definition for discriminating that to which positions of P2 and P1 is the bus bar electrode more closer.
Figure 18:
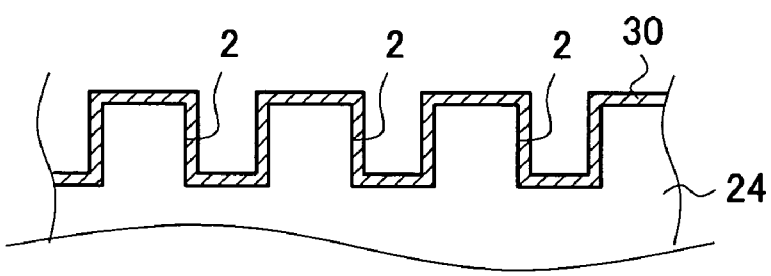
FIG. 18 is a schematic sectional view showing a first example of sectional form in the longitudinal direction of the bus bar electrode.
Figure 19:
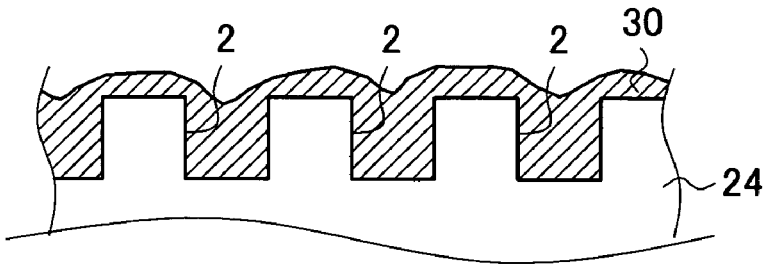
FIG. 19 is a schematic sectional view showing a second example of sectional form in the longitudinal direction of the bus bar electrode.

On the substrate 24 after completion of the above processes, a bus bar electrode 30 shown in FIGS. 14 to 16 is formed by a publicly-known method, and the silicon nitride film 7, which serves as a passivation film and an anti-reflection film, is uniformly formed on the first main surface 24a to a thickness of 60 to 70 nm typically by the remote plasma CVD process ((h) in FIG. 6), to thereby complete the final solar cell 1.

FIG. 14 shows an exemplary case where the bus bar electrode 30 is formed in an arc pattern along the outer circumference of the semiconductor single crystal substrate 24, and FIG. 16 in a kinked-line pattern along the outer circumference of the same.

In an exemplary case shown in FIG. 15, the bus bar electrode 30 is disposed so as to divide the finger electrodes 2 in the individual grooves 2, which fall in a partial groove array 40 of the entire array of the grooves 2 including the longest groove 2', into a first portion 2a on the thickest position P2 side and a second portion 2b, longer than the first portion 2a, on the thinnest position P1 side. The position of the bus bar electrode 30 is also adjusted so that longer grooves 2 will have larger lengths in the first portion 2a. More specifically, the bus bar electrode 30 is disposed in parallel to the aforementioned line DL in the partial groove array 40 where the longer grooves 2 have larger lengths in the first portion 2a. Although the longer grooves 2 have longer finger electrodes 2 and therefore tend to have larger resistance loss, the above-described positioning of the bus bar electrode 30 such as making the first position 2a longer is more advantageous in reducing the resistance loss since the second portion 2b can be shortened accordingly.

While the bus bar electrodes 30 illustrated in FIGS. 14 to 16 have a uniform width, it is more preferable to widen the bus bar electrodes 30 towards a position where a lead wire for output extraction is to be connected, because the portion closer to the lead wire can make a larger contribution on the current collection and have larger current flow. In an exemplary case where the lead wire is connected to a first end portion of the bus bar electrode 30, the electrode 30 can be formed so as to be widen from a second end portion towards the first end portion. In another exemplary case where the lead wire is connected to a middle point on the longitudinal direction of the bus bar electrode 30, the electrode 30 can be formed so as to be widened from both end portions towards the middle point.

Available methods of forming the bus bar electrode 30 include such as forming an electrode pattern by electrolytic plating or electroless plating of a metal such as Ni (or may combination of the both, such as electroless plating followed by electrolytic plating); such as forming an electrode pattern by vapor deposition of a metal such as Al; such as forming a printed pattern of a metal paste containing Ni or the like by screen printing and then sintering the printed pattern to thereby form an electrode; and such as press-bonding an electrode metal foil strip made of Al or the like onto the semiconductor single crystal substrate (heat setting also available if necessary). Bonding of the metal foil strip may sometimes cause difficulty in making close contact of the foil strip to the inner surface of the grooves having the finger electrodes already formed thereon, and thus may raise a problem in ensuring electric conductivity. In this case, it is beneficial to form a metal paste layer on one surface of the metal foil strip, and to make bonding on the metal paste layer side, where the metal paste filled in the grooves can facilitate establishment of the electric conduction between the finger electrodes and the metal foil strip. It is further preferable in this case to carry out sintering after bonding of the metal foil strip in view of further ensuring the adhesive force of the electrode.

Second Embodiment

An embodiment of the method of fabricating the solar cell according to the second aspect of the invention will be described. A target solar cell in the second embodiment is again the OECO cell shown in FIG. 1, similarly to the first embodiment. The aforementioned first embodiment used the upward-edge-type, high-speed rotary blade, dared to allow variation in the depth of the grooves 2 to generate according to the non-uniformity in the substrate thickness, and instead imposed the limitation expressed by the formula (1) on the depth of groove h' at the thinnest position in order to reduce the shadowing loss and electrode resistance loss. On the contrary, the present second aspect aims at equalizing the groove depths within a single substrate as possible.

In the present embodiment, a p-type silicon single crystal ingot, which is prepared by adding a Group Ill element such as boron or gallium to a high-purity silicon and manufactured by the CZ method or FZ method, is obtained, and p-type silicon single crystal substrates 24 are sliced out from the ingot. Preferable ranges for the specific resistance and substrate thickness of the p-type silicon single crystal substrates 24 are the same as those described in the first embodiment. It is to be noted that in the present embodiment, it is also allowable to use polysilicon ingot, and any of those manufactured by the publicly-known methods such as the HEM method, casting method and EFG resistance and substrate thickness of the p-type silicon single crystal substrates 24 are the same as those described in the first embodiment. It is to be noted that in the present embodiment, it is also allowable to use polysilicon ingot, and any of those manufactured by the publicly-known methods such as the HEM method, casting method and EFG method are available.

Figure 9A:
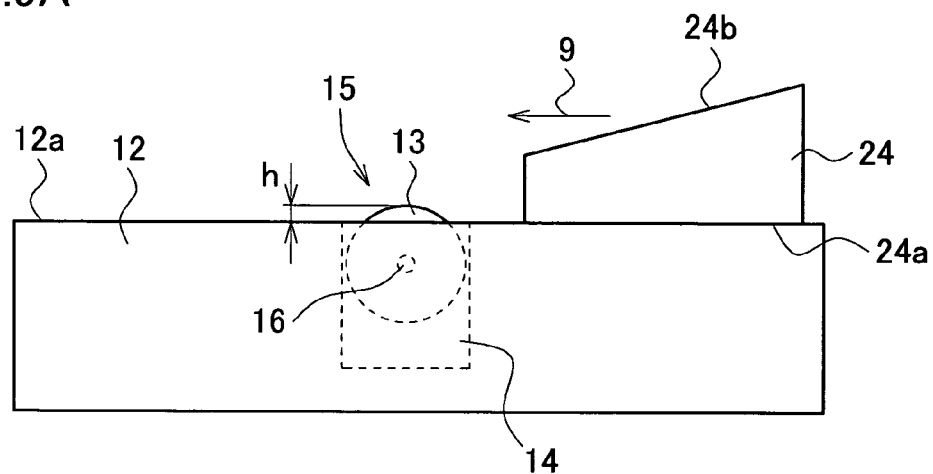
FIG. 9A is a schematic front elevation for explaining an exemplary method of forming the grooves in the method of fabricating the solar cell of the invention.
Figure 9B:
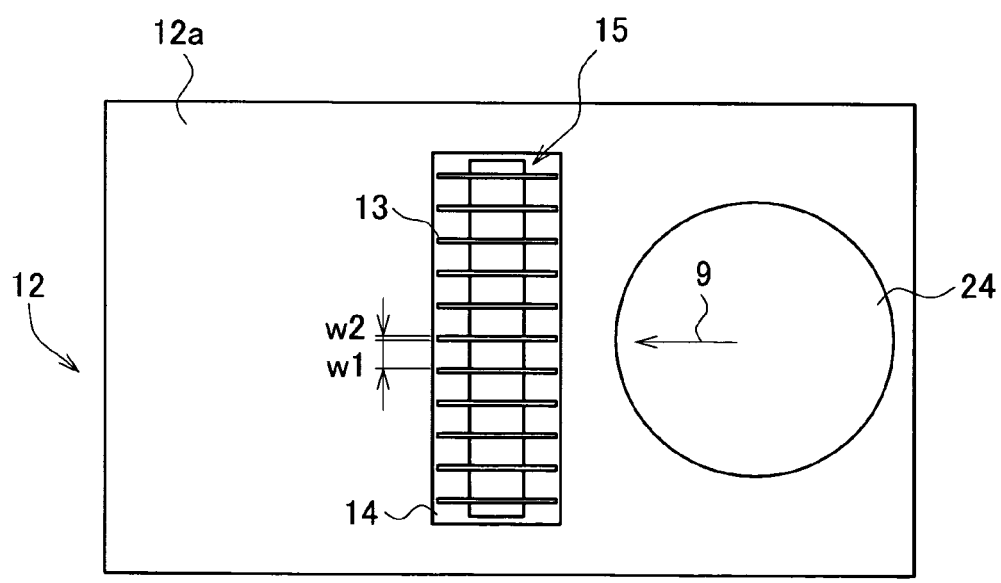
FIG. 9B is a schematic plan view for explaining an exemplary method of forming the grooves in the method of fabricating the solar cell of the invention.
Figure 13:
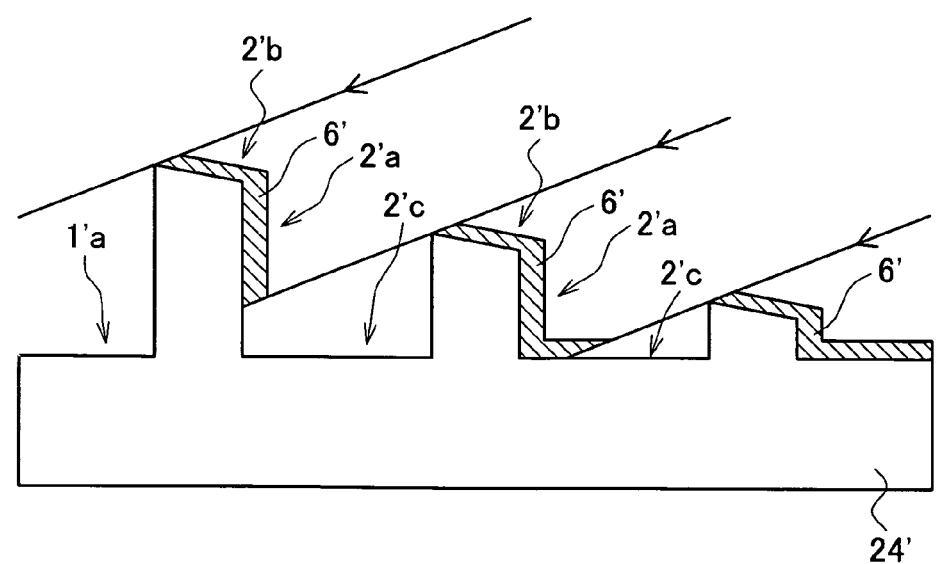
FIG. 13 is a schematic drawing showing a deposition status of the electrodes on a substrate having non-uniform thickness.

Next, as shown in FIGS. 9A and 9B, a plurality of parallel grooves 2 are formed on the first main surface 24a of the substrate 24 using a groove-carving blade. More specifically, a working table 12 is fixed so as to direct a substrate feeding surface 12a, on which the semiconductor single crystal substrate 24 is placed, upward. Edge portions 13 of rotary blade for the groove-carving are concentrically joined at regular intervals so as to rotate all together, thereby to configure a groove-carving edge complex 15, and the groove-carving edge complex 15 is set so as to allow the individual edge portions 13 to project out from openings 14 formed in the substrate feeding surface 12a of the working table 12 by the same height of projection h. The first main surface 24a on which the grooves 2 are to be formed is brought into close contact with the substrate feeding surface 12a of the working table 12, and the semiconductor single crystal substrate 24 is then moved towards the groove-carving edge complex 15, which is kept rotated around an axial line 16, normal to the thickness-wise direction of the edge portions 13 (as indicated by feeding direction 9 in FIGS. 9A and 9B). The semiconductor single crystal substrate 24 herein is moved while being chucked on the second main surface 24b. It is to be noted that FIG. 9A exaggerates the thickness of the semiconductor single crystal substrate 24, and thickness of the actual semiconductor single crystal substrate is approximately as small as ⅟₅₀₀ of the diameter thereof (The same applies to the afore-mentioned FIG. 13, and the after-mentioned FIGS. 10 and 11A).

Figure 10:
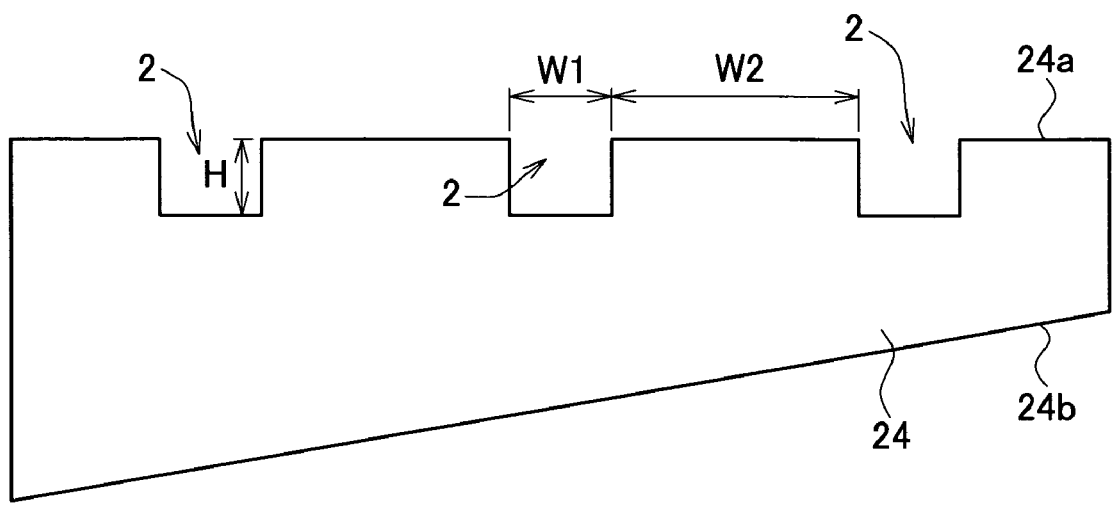
FIG. 10 is a schematic sectional view showing an exemplary method of forming the grooves in the method of fabricating the solar cell of the invention.

According to this process, a plurality of grooves having the same groove depth H, groove width W1 and inter-groove distance W2 corresponded to the height of projection h of the edge portions out from the substrate feeding surface 12a, thickness w1 of the edge portions 13 and inter-edge distance w2, respectively, can be formed even on the semiconductor single crystal substrate 24 having non-uniform thickness as shown in FIG. 10. Configuration and positioning of the groove-carving edge complex 15 may properly be altered depending on the desired style of the grooves 2 to be formed on the semiconductor single crystal substrate 24. A typical configuration of the groove-carving edge complex 15 relates to the number of edge portions 13 of 100 to 200, height of projection h of the edge portions 13 of several tens to 100 μm, thickness w1 of the edge portions 13 of several tens to 100 μm, and inter-edge distance w2 of several hundreds micrometer or around. Available edge portions 13 include a diamond edge (such as having the surface thereof uniformly adhered with diamond abrasive grain having a grain size of 5 μm to 10 μm). Using edge portions 13 having any of rectangular, semicircular, V- and U-sectional form as viewed in a section including the axis of rotation successively forms the grooves having any sectional forms correspondent to those of the edge portions as viewed in a section normal to the longitudinal direction of the grooves. Using thus-composed edge portions 13 (and the groove-carving edge complex 15 configured by joining the edge portions), the first main surface 24a of the substrate 24 are cut typically at a cutting speed of approximately 0.1 to 4 cm per second while injecting a cutting fluid to the carving site.

Figure 11A:
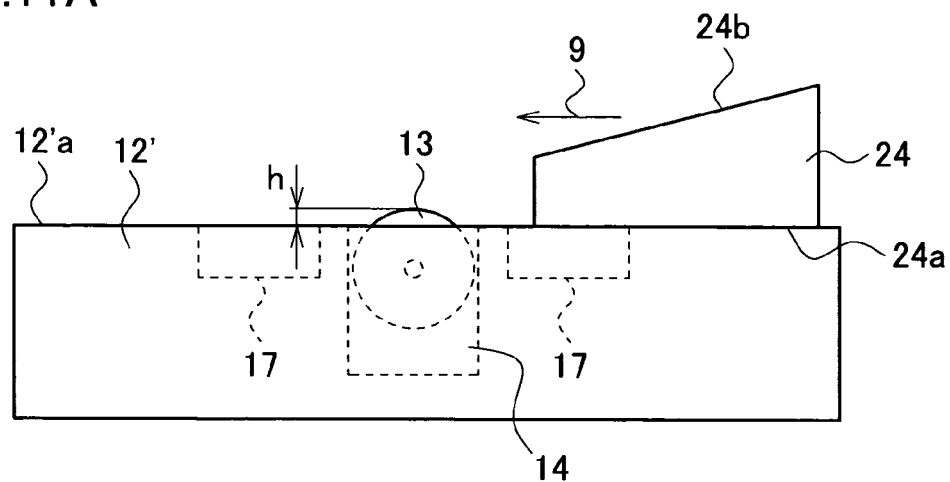
FIG. 11A is a schematic front elevation for explaining a modified example of the method of forming the grooves in the method of fabricating the solar cell of the invention.
Figure 11B:
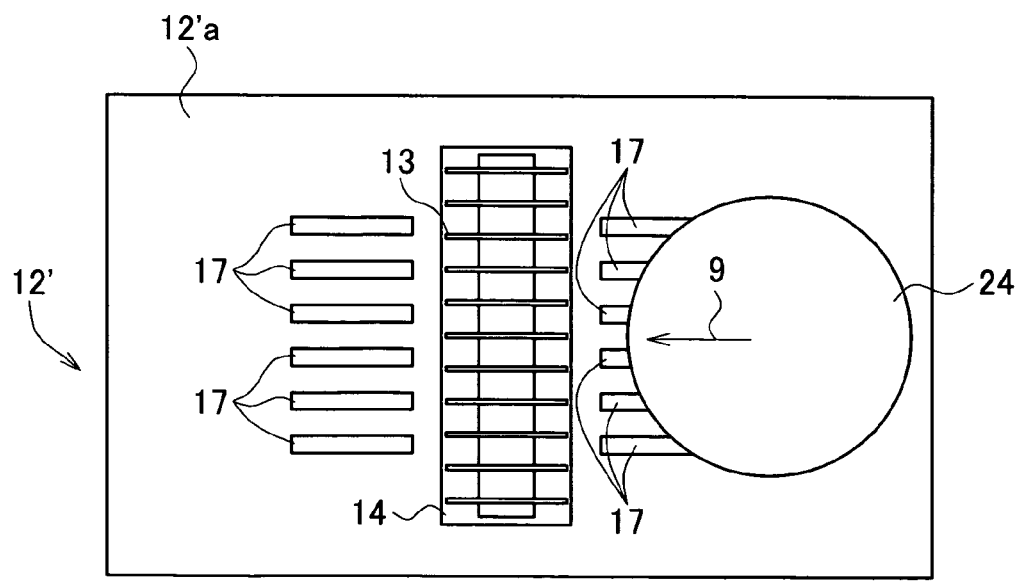
FIG. 11B is a schematic plan view for explaining a modified example of the method of forming the grooves in the method of fabricating the solar cell of the invention.
Figure 12:
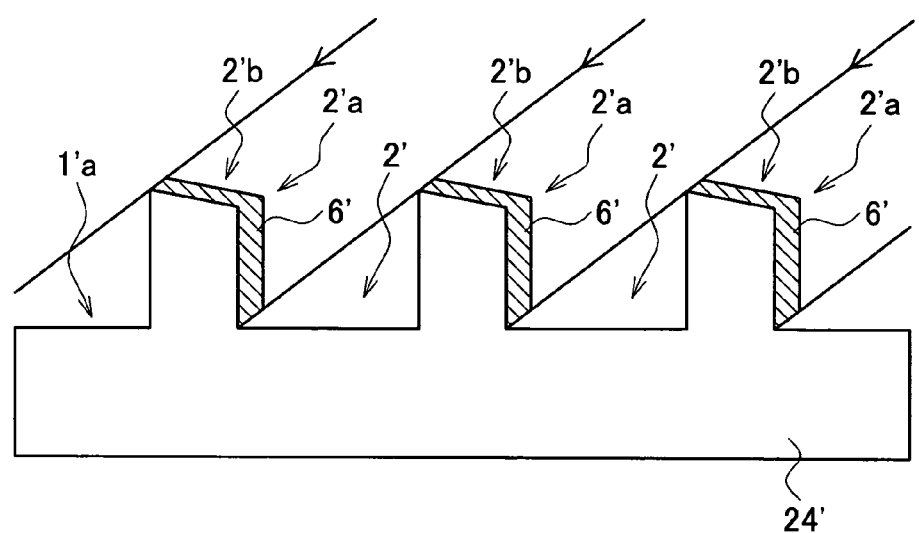
FIG. 12 is a schematic drawing showing a deposition status of the electrodes in the method of fabricating an OECO solar cell.

The groove carving on the first main surface of the solar cell can also be carried out using a working table 12' as shown in FIGS. 11A and 11B. A substrate feeding surface 12a' of the working table 12' has shaving discharge grooves 17 formed therein. The shaving discharge grooves 17 respectively have a rectangular shape of 0.5 to 5 mm wide, 10 to 30 cm long and 1 to 10 mm deep, and are aligned uniformly at intervals of 1 to 10 mm on the substrate feeding surface 12a' with which the semiconductor single crystal substrate 24 is brought into contact. By forming the shaving discharge grooves 17, the substrate feeding surface 12a' will have a reduced contact area with the semiconductor single crystal substrate 24, and this is advantageous in reducing friction resistance during moving of the substrate 24 and in raising the productivity as a consequence. This is still also advantageous in that the shaving produced with the progress of the groove carving is trapped into the shaving discharge grooves 17, and is no more likely to remain between the first main surface 24a of the semiconductor single crystal substrate 24 and the substrate feeding surface 12a. This helps retaining of a desirable status of close contact between the first main surface 24a of the semiconductor single crystal substrate 24 and the substrate feeding surface 12a, and allows depth of the resultant grooves 2 to be kept constant on the first main surface 24a.

It is to be noted that direction of formation of the shaving discharge grooves 17 formed on the substrate feeding surface 12' is more preferably in disagreement with the substrate feeding direction. For the case where the shaving discharge grooves 17 are provided, shaving generated with the progress of the groove carving tends to remain on the substrate feeding surface 12'a of the working table 12' and then migrates along the feeding direction 9 with the movement of the semiconductor single crystal substrate 24 in the same direction. The shaving discharge grooves 17 aligned in the direction in disagreement with the feeding direction 9 of the substrate 24 is successful in finally trapping the shaving.

Process steps following the groove carving are the same as those illustrated in process (a) to (h) of FIG. 6 explained in the first embodiment, and an obtainable solar cell 1 is also the same as that shown in FIG. 1. According to the method of the invention, the grooves 2 having a uniform depth can be formed on one main surface 24a of the substrate 24. This successfully equalizes the shadowing effect of every groove 2 exerted on the adjacent groove 2 in the OECO solar cell, and this consequently allows the electrodes 6 to be deposited in an equivalent amount in the individual grooves 2. The individual electrodes 6 can therefore be formed correctly conforming to the designed values, and the resistance loss and shadowing loss are suppressed.

It is to be noted that the aforementioned shape of edge portions of the groove-carving blade; and shape, configuration and disposition of the working table by no means limit the invention, where any proper modifications thereof based on technical knowledge of those skilled in the art are acceptable.

It is also to be noted that the invention is by no means limited to the present embodiment, and of course can be applicable in any modes of embodiment without departing from the spirit of the invention. For example, while both of the first and second embodiments exemplified the solar cells fabricated by the OECO process, the invention is not limited thereto, and is applicable to any other solar cells other than the OECO cells, so far as they require the groove carving at least on one main surface thereof, where suppression of variation in the cell characteristics and depression in the output can be expected.

The invention will further be detailed based on specific Examples.

EXAMPLE 1

A p-type single crystal silicon wafer 1 for fabricating solar cells, containing gallium, which is a Group III element, as an impurity element (diameter=4 inches, minimum thickness=270 μm, maximum thickness=300 μm, resistivity=0.5 Ω·cm) was obtained, and the thickness distribution thereof was preliminarily measured using a dial gouge. Based on the measured results, a plurality of parallel grooves 2 having a rectangular section were formed as shown in FIG. 3 using a dicing saw (high-speed rotary blade) in parallel to a line connecting the thickest position and thinnest position of the wafer. The edge portion of the grinding blade used herein was 450 μm in thickness, 50 mm in diameter and had an inter-edge interval of 50 μm. Based on the thickness of the grinding blade defined as 450 μm and on the angle of deposition, described later, as 5°, the minimum depth of the groove h was defined as 50 μm. Process conditions defined herein included a speed of rotation of the grinding blade of 50 rpm and a wafer feeding speed of 1 mm/s, where cooling water was supplied to the carving site. The wafer was chucked by a vacuum chuck on the surface opposite to the working surface. For comparison, a wafer having a uniform thickness was similarly processed to form the grooves under the same conditions (comparative wafer 1).

The wafer after the groove carving was etched using an aqueous potassium hydroxide solution to thereby remove the damaged layer, and a silicon nitride film 8 was formed on the back surface using a plasma CVD apparatus. Phosphorus, which is a Group V element, was then introduced into the light-receiving surface side by thermal diffusion to thereby form the $n^+$ region 4 having a sheet resistance of 100 Ω/□. The back surface was then processed to form the grooves 8a for electrode contact using the rotary blade, and the electrode 9 of 2 μm thick was then formed by vapor deposition of aluminum. Next, the tunnel oxide film 5 of 2 nm thick was formed on the light-receiving surface by thermal oxidation, and aluminum, which is an electrode material, was then vapor-deposited from the direction normal to the longitudinal direction of the parallel grooves and inclined at 5° away from the wafer surface, to thereby form the electrodes 6 of 7 μm thick on the inner side faces of the grooves only on one side. Unnecessary portion of the metal deposited also on the top surface of the projected ridges was then removed by etching using an aqueous phosphoric acid solution. A wide bus bar electrode was then formed so as to be connect to the individual electrodes, and the silicon nitride film 7 of 70 nm thick, aimed at providing an anti-reflective measure against the sunlight and surface protection, was formed on the light-receiving surface by plasma CVD, to thereby fabricate a solar cell of the invention (inventive cell 1) and a solar cell for comparison (comparative cell 1).

Output characteristics of thus-fabricated solar cells were measured using a solar simulator (light intensity: 1 kW/m$^2$, spectrum: AM1.5 global). Measured results of the output characteristics were shown in Table 1.

TABLE 1

|  | Short-circuiting current (A) | Open-circuit voltage (V) | Fill factor (%) | Maximum output (W) |
| --- | --- | --- | --- | --- |
| Inventive cell 1 | 3.03 | 0.677 | 76.0 | 1.55 |
| Comparative cell 1 | 3.05 | 0.680 | 76.8 | 1.59 |

As far as the above results suggested, no distinctive difference in the output was found between the inventive cell 1 and comparative cell 1. This indicates that, the solar cell of the invention, even non-uniform in the wafer thickness, can successfully achieve a high output equivalent to that of the comparative cell uniform in the wafer thickness.

Figure 7:
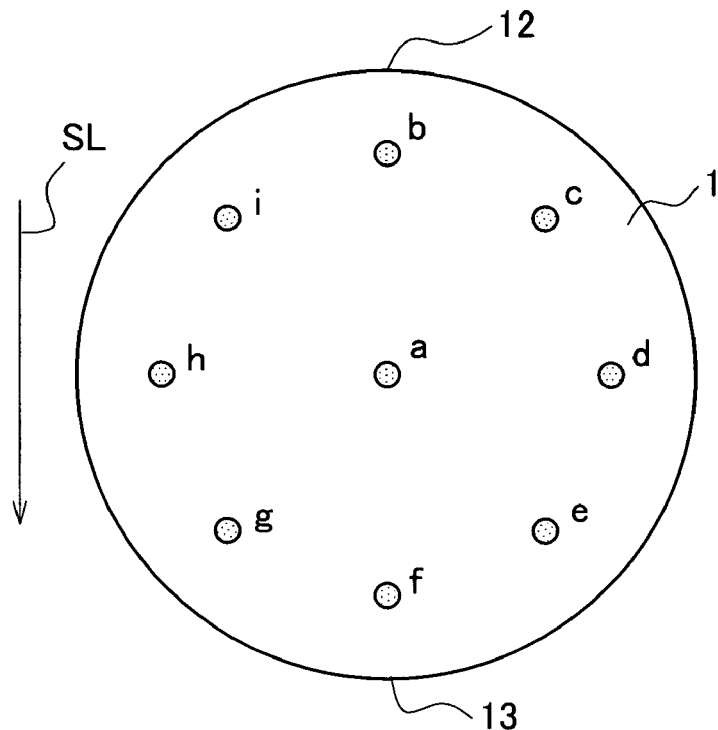
FIG. 7 is a drawing showing points of measurement of electrode formation length in the thickness-wise direction of the substrate of the solar cell shown in Example 1.
Figure 8:
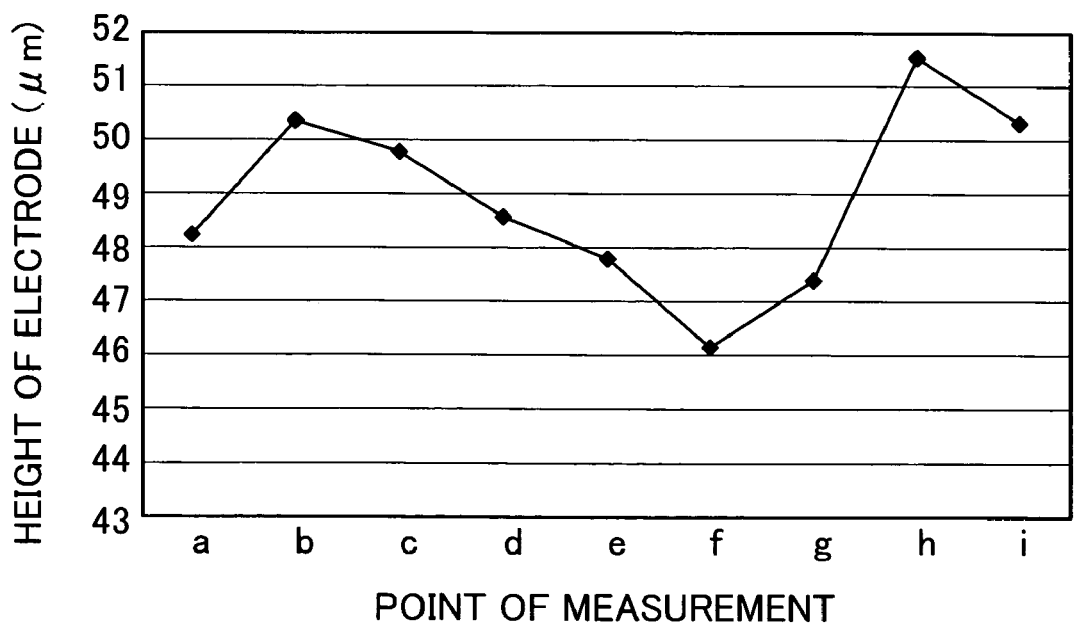
FIG. 8 is a graph showing measurement results of the electrode height in Example 1.

Next, heights (length in the thickness-wise direction of the substrate) of the electrodes on the inner side face of the grooves of the inventive cell 1 were measured under a SEM. Results of the measurement were shown in FIG. 8. The measurement was made on total 9 points as shown in FIG. 7, where one point a is at the center, and the other points b to i are positioned on a 3.5-cm-diameter circle around the center, starting at the position along the groove forming direction and aligned thereafter at 45° intervals. Arrow SL in FIG. 7 indicates the direction of slicing the silicon crystal ingot, and the substrate is gradually thinned from position 12 towards position 13.

From results of the measurement, a standard deviation σ of the electrode height was found to be 1.7, which was equivalent to a maximum of 10% or around when converted into difference in sectional area of the electrodes. Considering now that resistance loss of the electrodes of the general solar cells amounts approximately 5% of the output, it was estimated that influence of the above-described variation in the sectional area of the substrate amounted only as small as approximately 0.5% of the output. It was thus concluded that variation of this degree did not largely affect the energy conversion efficiency of the solar cell and was ignorable.

EXAMPLE 2

On the light-receiving surface side of a p-type single crystal silicon wafer 1 for fabricating solar cells, containing boron, which is a Group III element, as an impurity element (diameter=4 inches, minimum thickness=270 μm, maximum thickness=300 μm, resistivity=2.0 Ω·cm), a plurality of parallel grooves having a rectangular section were formed using a dicing saw. The grooves were formed so as to be in parallel to a line connecting the thickest position and thinnest position of the wafer. The edge portion of the grinding blade used herein was 450 μm in thickness, 50 mm in diameter and had an inter-edge interval of 50 μm, similarly to Example 1. Based on the thickness of the grinding blade defined as 450 μm and on the angle of deposition as 5°, the minimum depth of the groove h was defined as 50 μm. Process conditions defined herein included a speed of rotation of the grinding blade of 60 rpm and a wafer feeding speed of 1.5 mm/s, where cooling water was supplied to the carving site. The wafer was chucked by a vacuum chuck on the surface opposite to the working surface. For comparison, a wafer on which the longitudinal direction of the grooves is normal to the line connecting the thickest position and thinnest position of the wafer (i.e., normal to the groove direction shown in FIG. 3) was also fabricated (comparative wafer 2). Both wafers were then respectively subjected to the fabrication processes similarly to those in Example 1, to thereby fabricate a solar cell of the invention (inventive cell 2) and a solar cell for comparison (comparative cell 2).

Output characteristics of thus-fabricated solar cells were measured using a solar simulator (light intensity: 1 kW/m$^2$, spectrum: AM1.5 global). Measured results of the output characteristics were shown in Table 2.

TABLE 2

| | Short-circuiting current (A) | Open-circuit voltage (V) | Fill factor (%) | Maximum output (W) |
|---|---|---|---|---|
| Inventive cell 2 | 3.03 | 0.680 | 76.7 | 1.58 |
| Comparative cell 2 | 3.01 | 0.677 | 74.8 | 1.52 |

The inventive cell 2 showed a fill factor larger by approximately 1.9% than that of comparative cell 2, and showed a higher output. It was thus concluded that adoption of the invention was successful in obtaining higher output.

The solar cells were further measured for current-voltage characteristics in an absolute darkness based on the four-terminal method, to thereby estimate the series resistance. Measurement results were shown in Table 3.

TABLE 3

| | Series resistance (Ω · cm$^2$) |
|---|---|
| Inventive cell 2 | 1.18 |
| Comparative cell 2 | 1.73 |

It was found from the results that series resistances of the inventive cell 2 and comparative cell 2 differed by 0.55 Ω·cm$^2$. It was thus considered that the aforementioned difference in the fill factor was ascribable to the difference in the series resistance. As for OECO cells, resistance loss of the finger electrodes can successfully be reduced and thus the output can be increased by forming the grooves in parallel to the line connecting the thickest point and thinnest point of the wafer.

On the light-receiving surface side of a p-type single crystal silicon substrate for fabricating solar cells, containing gallium, which is a Group III element, as an impurity element (10 cm square, substrate thickness =300 μm, resistivity =0.5 Ω·cm, variation in thickness =max. 25 μm), a plurality of parallel grooves having a rectangular section were formed according to the fabrication method of the invention. The edge portions of the groove-carving blade used herein were 450 μm in thickness, 50 mm in diameter, and were joined while keeping the inter-edge intervals of 50 μm to thereby configure a groove-carving edge complex. The groove-carving edge complex was set at a projection height h of 50 μm above the working table. Process conditions defined herein included a speed of rotation of the groove-carving edge complex of 50 rpm, and a substrate feeding speed of 1 mm/s. The wafer was chucked by a vacuum chuck on the surface (second main surface) opposite to the first main surface on which the grooves are to be formed, and the first main surface was brought into close contact with the substrate feeding surface of the working table. The substrate was then moved along the direction normal to the thickness-wise direction of the groove-carving edges, while feeding cooling water to the working site as explained in the above referring to FIGS. 9A and 9B, to thereby form a plurality of grooves on the semiconductor single crystal substrate. The semiconductor single crystal substrate obtained in this process will be referred to as inventive substrate 3.

For comparison, another semiconductor single crystal substrate was fixed on the working table, allowed the groove-carving edges to bite in the upper surface of the substrate, and groove-carving edges were then moved in parallel to the substrate feeding surface of the working table to thereby form the grooves according to the conventional method. The semiconductor single crystal substrate obtained in this process will be referred to as comparative substrate 3.

The individual substrates were then etched using an aqueous potassium hydroxide solution to thereby remove the damaged layer, and a silicon nitride film was formed on the back surface using a plasma CVD apparatus. Phosphorus, which is a Group V element, was then introduced as an impurity into the light-receiving surface side by thermal diffusion to thereby form the n-type emitter layer having a sheet resistance of 100 Ω/□. The electrode of 2 μm thick was then formed on the back surface by vapor deposition of aluminum. Next, the tunnel oxide film of 2 nm thick was formed on the light-receiving surface by thermal oxidation, and aluminum was then vapor-deposited from the direction normal to the longitudinal direction of the parallel grooves and inclined at 5° away from the first main surface, to thereby form the electrodes of 5 μm thick on the inner side faces of the grooves only on one side. Unnecessary portion of the metal deposited also on the top surface of the projected ridges between every adjacent grooves was then removed by etching using an aqueous phosphoric acid solution. The silicon nitride film of 70 nm thick, aimed at providing an anti-reflective measure against the sunlight and surface protection, was formed on the light-receiving surface by plasma CVD, to thereby fabricate the solar cells.

Current-voltage characteristics of the solar cells were measured using a solar simulator (light intensity: 1 kW/m$^2$, spectrum: AM1.5 global). Various characteristics derived from the current-voltage characteristics were shown in Table 4.

TABLE 4

| | Short-circuiting current (A) | Open-circuit voltage (V) | Fill factor (%) | Maximum output (W) |
|---|---|---|---|---|
| Inventive cell 3 | 3.90 | 0.675 | 77.0 | 2.03 |
| Comparative cell 3 | 3.94 | 0.680 | 71.3 | 1.91 |

It was found from the results that the inventive cell 3 showed a fill factor (curve factor of current-voltage curve) larger by 5.7% than that of the comparative cell 3, indicating a high maximum output. Next, electrode formed on the surface of the solar cells were observed under a SEM. It was found that the comparative cell 3 was short of electrode height in the grooves by maximum 15 μm or around over the entire light-receiving surface as compared with the inventive cell 3. Difference in the output shown in Table 4 in the above was mainly ascribable to difference in the fill factor. It was considered that the difference in the fill factor was caused by increase in series resistance due to shortage in sectional area of the electrodes which was revealed by the SEM observation.

As is clear from the above, the invention is successful in almost equalizing the height of all finger electrodes formed on the inner side faces of the grooves, and in suppressing variations in the characteristics over the entire portion of the light-receiving surface. This makes it possible to fabricate the electrode capable of suppressing increase in the series resistance, and to obtain a high-output solar cell.

EXAMPLE 4

Groove carving according to the invention was carried out using a working table as shown in FIG. 11A and FIG. 11B, having formed thereon parallel shaving discharge grooves of 2 mm wide, 5 mm deep, formed at inter-groove intervals of 2 mm in parallel to the substrate feeding direction. The substrate used herein was a p-type single crystal silicon substrate for fabricating solar cells, containing boron, which is a Group III element, as an impurity element (10 cm square, substrate thickness =250 μm, resistivity =1.0 Ω· cm, variation in thickness=max. 20 μm). The groove-carving blade used herein was composed of rectangular-sectioned edge portions having a thickness of 450 μm and a diameter of 50 mm, which were joined while keeping the inter-edge intervals of 50 μm to thereby configure a groove-carving edge complex. The groove-carving edge complex was set at a projection height h of 50 μm above the working table. Process conditions defined herein included a speed of rotation of the groove-carving edge complex of 60 rpm, and a substrate feeding speed of 1.25 mm/s, and the grooves were formed on the first main surface by moving the substrate similarly to as described in Example 3.

Another experiment of the groove carving was also carried out using a working table having no shaving discharge grooves under the same conditions. Fifty each of the individual samples were processed, and acceptable ratio was determined assuming the samples having no crack or chipping after the groove carving, and having no nonconformities such as shift from the set value of the groove depth as acceptable samples. The acceptable ratio was found to be 83% when the working table without the shaving discharge grooves was used, but found to be 98% when the working table with the shaving discharge grooves was used, where the acceptable ratio was improved by as much as 15%. This proved improvement in the productivity.

The invention claimed is:

1. A solar cell having a light-receiving surface which is configured by a first main surface of a semiconductor single crystal substrate having a plurality of nearly-parallel grooves formed thereon, each groove having an electrode for extracting output disposed on the inner side face thereof only on one side in the width-wise direction thereof, wherein a minimum depth h of each groove satisfies the relation below:

$h \geq W_1 \tan\theta$ where, θ represents an angle between a line which connects the lower end, along the thickness-wise direction of the semiconductor single crystal substrate, of the electrode formed in one groove having the largest depth among all grooves as viewed along an arbitrary section normal to the longitudinal direction of the individual grooves, and the upper end of the inner side face of the same groove having no electrode formed thereon, and a reference line normal to the thickness-wise direction, and $W_t$ represents width of the groove defined by a distance between both opening edges of the groove, and wherein the semiconductor single crystal substrate has thickness decreasing from a first side of a first main surface to a second side opposed to the first side; and wherein the plurality of grooves have a depth distribution of being deepest at a thickest position of the semiconductor single crystal substrate, and a gradually becoming shallower towards a thinnest position of the substrate.

2. The solar cell as claimed in claim 1, wherein the thickness of the semiconductor single crystal substrate at the bottom portions of the individual grooves observed in the section is uniform.

3. The solar cell as claimed in claim 2, wherein the longitudinal direction of the individual grooves lies in parallel to, or inclined at an angle of 45° or less away from a reference line, the reference line being defined as a line along the first main surface of the substrate, connecting a thickest position and a thinnest position of the semiconductor substrate.

4. The solar cell as claimed in claim 3, wherein the first main surface has a bus bar electrode formed thereon across the individual grooves so as to electrically connect the electrodes formed in the grooves with each other, where position of formation of the bus bar electrode being determined more closer to the thickest position rather than to the thinnest position.

5. The solar cell as claimed in claim 4, wherein, assuming that the semiconductor single crystal substrate is halved by a line drawn normally through the middle point of a line connecting the thickest position and thinnest position, the entire portion of the bus bar electrode falls within the half to which the thickest position belongs.

6. The solar cell as claimed in claim 5, wherein the bus bar electrode is disposed in relation to the entire array of the grooves or a part of the array including the longest groove, so as to divide the electrodes formed in the grooves into a first portion disposed on the side closer to the thickest position and a second portion disposed on the side closer to the thinnest position and longer than the first portion, and position of the bus bar electrode being adjusted so that the longer grooves has longer first portions.

7. The solar cell as claimed in claim 4, wherein the bus bar electrode is disposed in relation to the entire array of the grooves or a part of the array including the longest groove, so as to divide the electrodes formed in the grooves into a first portion disposed on the side closer to the thickest position and a second portion disposed on the side closer to the thinnest position and longer than the first portion, and position of the bus bar electrode being adjusted so that the longer grooves has longer first portions.

8. The solar cell as claimed in claim 3, wherein the semiconductor single crystal substrate is a silicon single crystal substrate, the first main surface has a surface orientation of nearly {100}, and the grooves are formed on the first main surface in a direction in disagreement with the <110> direction.

9. The solar cell as claimed in claim 2, wherein the semiconductor single crystal substrate is a silicon single crystal substrate, the first main surface has a surface orientation of nearly {100}, and the grooves are formed on the first main surface in a direction in disagreement with the <110> direction.

10. The solar cell as claimed in claim 1, wherein the first main surface has a bus bar electrode formed thereon across the individual grooves so as to electrically connect the electrodes formed in the grooves with each other, where position of formation of the bus bar electrode being determined more closer to the thickest position rather than to the thinnest position.

11. The solar cell as claimed in claim 10, wherein, assuming that the semiconductor single crystal substrate is halved by a line drawn normally through the middle point of a line connecting the thickest position and thinnest position, the entire portion of the bus bar electrode falls within the half to which the thickest position belongs.

12. The solar cell as claimed in claim 11, wherein the bus bar electrode is disposed in relation to the entire array of the grooves or a part of the array including the longest groove, so as to divide the electrodes formed in the grooves into a first portion disposed on the side closer to the thickest position and a second portion disposed on the side closer to the thinnest position and longer than the first portion, and position of the bus bar electrode being adjusted so that the longer grooves has longer first portions.

13. The solar cell as claimed in claim 10, wherein the bus bar electrode is disposed in relation to the entire array of the grooves or a part of the array including the longest groove, so as to divide the electrodes formed in the grooves into a first portion disposed on the side closer to the thickest position and a second portion disposed on the side closer to the thinnest position and longer than the first portion, and position of the bus bar electrode being adjusted so that the longer grooves has longer first portions.

14. The solar cell as claimed in claim 1, wherein the semiconductor single crystal substrate is a silicon single crystal substrate, the first main surface has a surface orientation of nearly {100}, and the grooves are formed on the first main surface in a direction in disagreement with the <110> direction.

15. The solar cell as claimed in claim 1, wherein the semiconductor single crystal substrate is a silicon single crystal substrate, the first main surface has a surface orientation of nearly {100}, and the grooves are formed on the first main surface in a direction in disagreement with the <110> direction.

* * * * *